(12) United States Patent
Lin et al.

(10) Patent No.: US 12,243,786 B2
(45) Date of Patent: Mar. 4, 2025

(54) SEMICONDUCTOR DEVICE AND METHODS OF FORMING THE SAME

(71) Applicant: Taiwan Semiconductor Manufacturing Co., Ltd., Hsinchu (TW)

(72) Inventors: Cheng-I Lin, Hsinchu (TW); Da-Yuan Lee, Jhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 299 days.

(21) Appl. No.: 17/744,334

(22) Filed: May 13, 2022

(65) Prior Publication Data

US 2023/0282524 A1 Sep. 7, 2023

Related U.S. Application Data

(60) Provisional application No. 63/268,871, filed on Mar. 4, 2022.

(51) Int. Cl.
*H01L 21/8238* (2006.01)
*H01L 27/092* (2006.01)

(52) U.S. Cl.
CPC ......... *H01L 21/823878* (2013.01); *H01L 21/823821* (2013.01); *H01L 27/0924* (2013.01)

(58) Field of Classification Search
CPC ..... H01L 21/823878; H01L 21/823821; H01L 27/0924; H01L 29/6681; H01L 21/823431; H01L 21/823481; H01L 27/0886; H01L 29/785; H01L 29/51; H01L 29/66545; H01L 29/66795
See application file for complete search history.

(56) References Cited

U.S. PATENT DOCUMENTS 10,424,580 B2    9/2019  Cappellani et al.
11,837,504 B2   12/2023  Chiang et al.
(Continued)

FOREIGN PATENT DOCUMENTS

KR    20190024534 A    3/2019
TW      201342613 A   10/2013
(Continued)

*Primary Examiner* — Karen Kusumakar
*Assistant Examiner* — Adam S Bowen
(74) *Attorney, Agent, or Firm* — Slater Matsil, LLP

(57) ABSTRACT

An embodiment includes a device including a first semiconductor fin extending from a substrate, a second semiconductor fin extending from the substrate, a hybrid fin over the substrate, the hybrid fin disposed between the first semiconductor fin and the second semiconductor fin, and the hybrid fin having an oxide inner portion extending downward from a top surface of the hybrid fin. The device also includes a first isolation region between the second semiconductor fin, the first semiconductor fin, and the hybrid fin, the hybrid fin extending above a top surface of the first isolation region, a high-k gate dielectric over sidewalls of the hybrid fin, sidewalls of the first semiconductor fin, and sidewalls of the second semiconductor fin, a gate electrode on the high-k gate dielectric, and source/drain regions on the first semiconductor fin on opposing sides of the gate electrode.

20 Claims, 34 Drawing Sheets

(56) References Cited

U.S. PATENT DOCUMENTS

| | | |
|---|---|---|
| 2011/0204747 A1 | 8/2011 | Chen et al. |
| 2019/0103304 A1* | 4/2019 | Lin .................... H01L 29/66545 |
| 2019/0385898 A1* | 12/2019 | Peng ................. H01L 21/02271 |
| 2020/0058649 A1* | 2/2020 | Ching ................. H01L 29/7848 |
| 2020/0066718 A1* | 2/2020 | Li ....................... H01L 29/6681 |
| 2020/0091142 A1* | 3/2020 | Ching ................. H01L 27/0886 |
| 2020/0091311 A1* | 3/2020 | Hsu ................. H01L 21/823431 |
| 2020/0105583 A1* | 4/2020 | Wang ................. H01L 27/0886 |
| 2020/0119160 A1* | 4/2020 | Ching ............. H01L 21/823481 |
| 2020/0126989 A1 | 4/2020 | Liaw |
| 2020/0373206 A1 | 11/2020 | Cheng et al. |
| 2021/0126110 A1 | 4/2021 | Lin et al. |
| 2021/0376113 A1 | 12/2021 | Kao et al. |
| 2022/0037321 A1 | 2/2022 | Kao et al. |
| 2022/0045051 A1 | 2/2022 | You et al. |
| 2022/0336472 A1 | 10/2022 | Wang et al. |

FOREIGN PATENT DOCUMENTS

| | | |
|---|---|---|
| TW | 202029462 A | 8/2020 |
| TW | 202131389 A | 8/2021 |

\* cited by examiner

US 12,243,786 B2

SEMICONDUCTOR DEVICE AND METHODS OF FORMING THE SAME

PRIORITY CLAIM AND CROSS-REFERENCE

This application claims the benefit of U.S. Provisional Application No. 63/268,871 filed on Mar. 4, 2022, application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
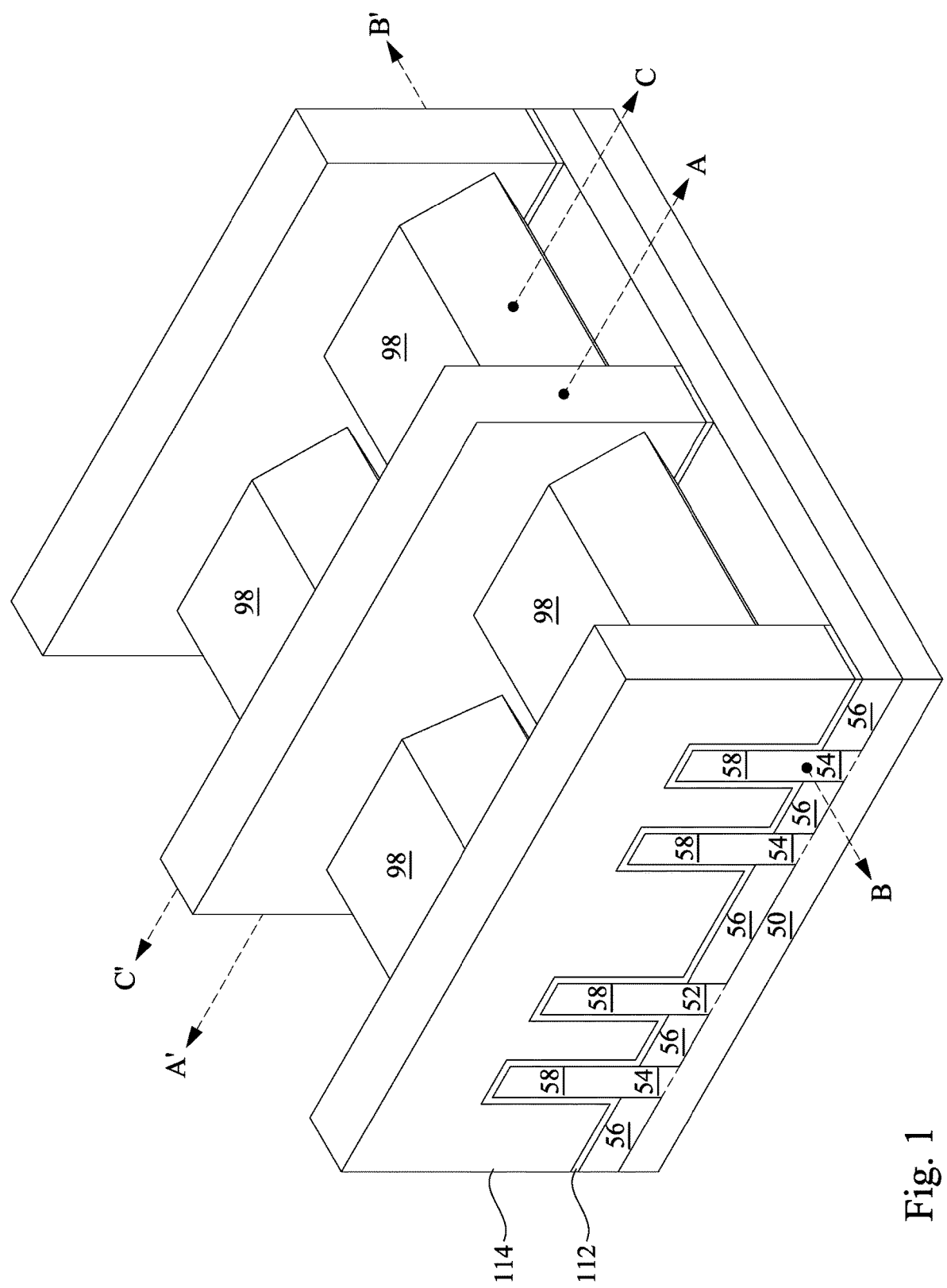
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, hybrid fins are formed adjacent and between semiconductor fins. The hybrid fins include seams that are filled by a silicon precursor soaking process and an oxidation process. These processes simultaneously form the interfacial layer(s) under the replacement gate structures such that extra processing is not needed to fill the seams of the hybrid fins. Filling the seams of the hybrid fins prevents conductive material from subsequently formed source/drain and/or gate contacts to form in the seams. Preventing the conductive material from source/drain and/or gate contacts to form in the seams prevents the source/drains and gates from shorting to each other through the seams. Manufacturing yield of the devices may thus be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include semiconductor fins 54 extending from a substrate 50 (e.g., a semiconductor substrate), with the semiconductor fins 54 acting as channel regions 58 for the FinFETs. Isolation regions 68, such as shallow trench isolation (STI) regions, are disposed between adjacent semiconductor fins 54, which may protrude above and from between adjacent isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 54 are illustrated as being single, continuous materials with the substrate 50, the bottom portions of the semiconductor fins 54 and/or the substrate 50 may include a single material or a plurality of materials. In this context, the semiconductor fins 54 refer to the portion extending from between the adjacent isolation regions 68.

Gate dielectrics 112 are along sidewalls and over top surfaces of the semiconductor fins 54. Gate electrodes 114 are over the gate dielectrics 112. Epitaxial source/drain regions 98 are disposed in opposite sides of the semiconductor fins 54 with respect to the gate dielectrics 112 and gate electrodes 114. The epitaxial source/drain regions 98 may be shared between various semiconductor fins 54. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 114. Cross-section B-B' is perpendicular to cross-section A-A' and is along a longitudinal axis of a semiconductor fin 54 and in a direction of, for example, a current flow between the epitaxial source/drain regions 98 of a FinFET. Cross-section C-C' is parallel to cross-section A-A' and extends through epitaxial source/drain regions 98 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-19 are views of intermediate stages in the manufacturing of FinFETs, in accordance with some embodiments. FIGS. 2, 3, 4, 5, 6, 7, 8, 9A, 10A, 11A, 12A, 13A, 14A, 15A, 16A, 17A, 18A, and 19 are cross-sectional views illustrated along a similar cross-section as reference cross-section A-A' in FIG. 1. FIGS. 9B, 10B, 11B, 12B, 13B, 14B, 15B, 16B, 17B, and 18B are cross-sectional views illustrated along a similar cross-section as reference cross-section B-B' in FIG. 1. FIGS. 9C, 10C, 11C, 12C, 13C, 14C, 15C, 16C, 17C, and 18C are cross-sectional views illustrated along a similar cross-section as reference cross-section C-C' in FIG. 1.

Figure 2:
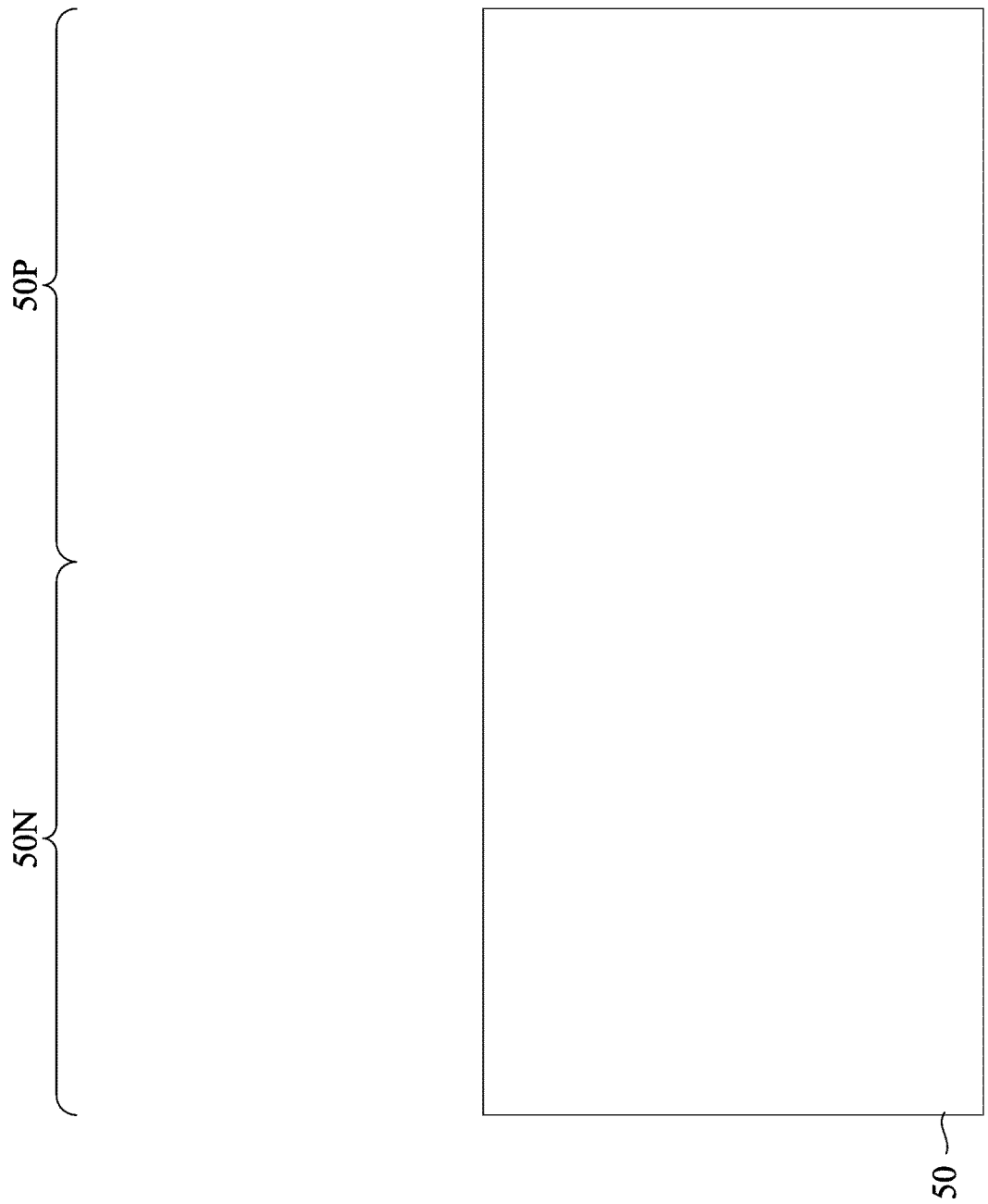
FIGS. 2-19 are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Figure 3:
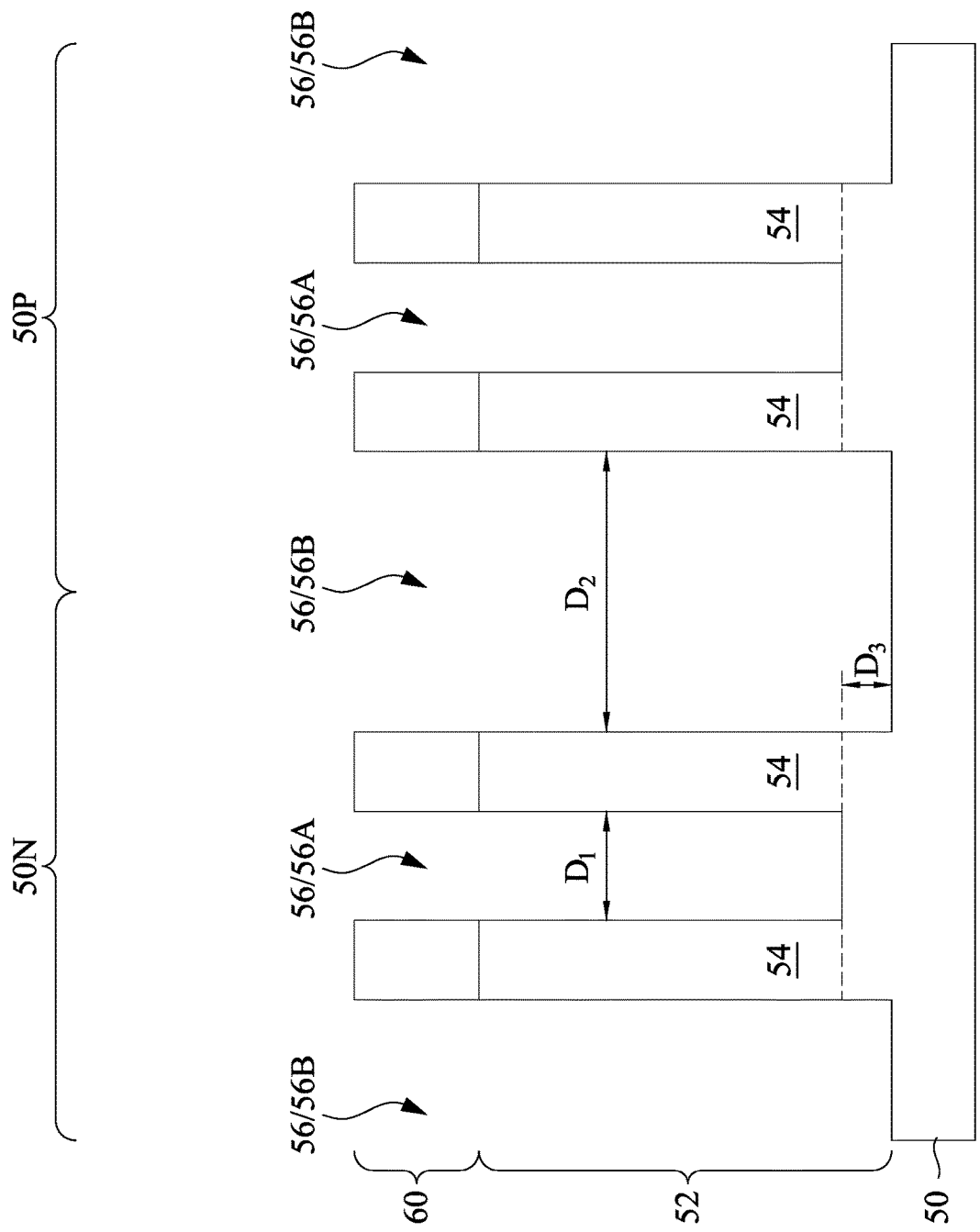

In FIG. 3, fin structures 52 are formed in the substrate 50. The fin structures 52 include semiconductor fins 54, which are semiconductor strips. The fin structures 52 may be formed in the substrate 50 by etching trenches 56 in the substrate 50. The etching may be any acceptable etching process, such as a reactive ion etch (RIE), neutral beam etch (NBE), the like, or a combination thereof. The etching process may be anisotropic.

The fin structures 52 may be patterned by any suitable method. For example, the fin structures 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks 60 to pattern the fin structures 52. In some embodiments, the masks 60 (or other layer) may remain on the fin structures 52.

In the illustrated embodiment, the fin structures 52 each have two semiconductor fins 54. However, the fin structures 52 may each have any quantity of the semiconductor fins 54, such as one, two, three, or more semiconductor fins 54. Further, different fin structures 52 may have different quantities of semiconductor fins 54. For example, fin structures 52 in a first region of a die (e.g., a core logic region) may have a first quantity of semiconductor fins 54, and fin structures 52 in a second region of the die (e.g., an input/output region) may have a second quantity of semiconductor fins 54, with the second quantity being different from the first quantity.

The trenches 56 may have different widths. In some embodiments, a first subset of the trenches 56A have a smaller width than a second subset of the trenches 56B. The trenches 56A separate the semiconductor fins 54 of respective fin structures 52, and the trenches 56B separate the fin structures 52 from each other. The semiconductor fins 54 of respective fin structures 52 are spaced apart by a lesser distance than the fin structures 52 are spaced apart from each other. In some embodiments, the semiconductor fins 54 of respective fin structures 52 are spaced apart by a distance $D_1$ in the range of 5 nm to 100 nm, the fin structures 52 are spaced apart from each other by a distance $D_2$ in the range of 20 nm to 200 nm, and the distance $D_2$ is greater than the distance $D_1$. The trenches 56 may be formed with different widths by patterning the masks 60 with a pattern having features spaced apart by different distances that correspond to the different widths of the trenches 56. The widths of the trenches 56 defines the width of the semiconductor fins 54 (also referred to as the critical dimension of the semiconductor fins 54). In some embodiments, the semiconductor fins 54 have a critical dimension in the range of 5 nm to 30 nm.

In some embodiments, the trenches 56 have different depths. For example, the trenches 56A may have a smaller depth than the trenches 56B. The trenches 56 may be formed with different depths as a result of pattern loading effects during etching of the trenches 56, with the pattern loading effects caused by the pattern of the masks 60 having features spaced apart by different distances. The depths of the trenches 56 defines the height of the semiconductor fins 54. In some embodiments, the semiconductor fins 54 have a height in the range of 10 nm to 100 nm.

Figure 4:
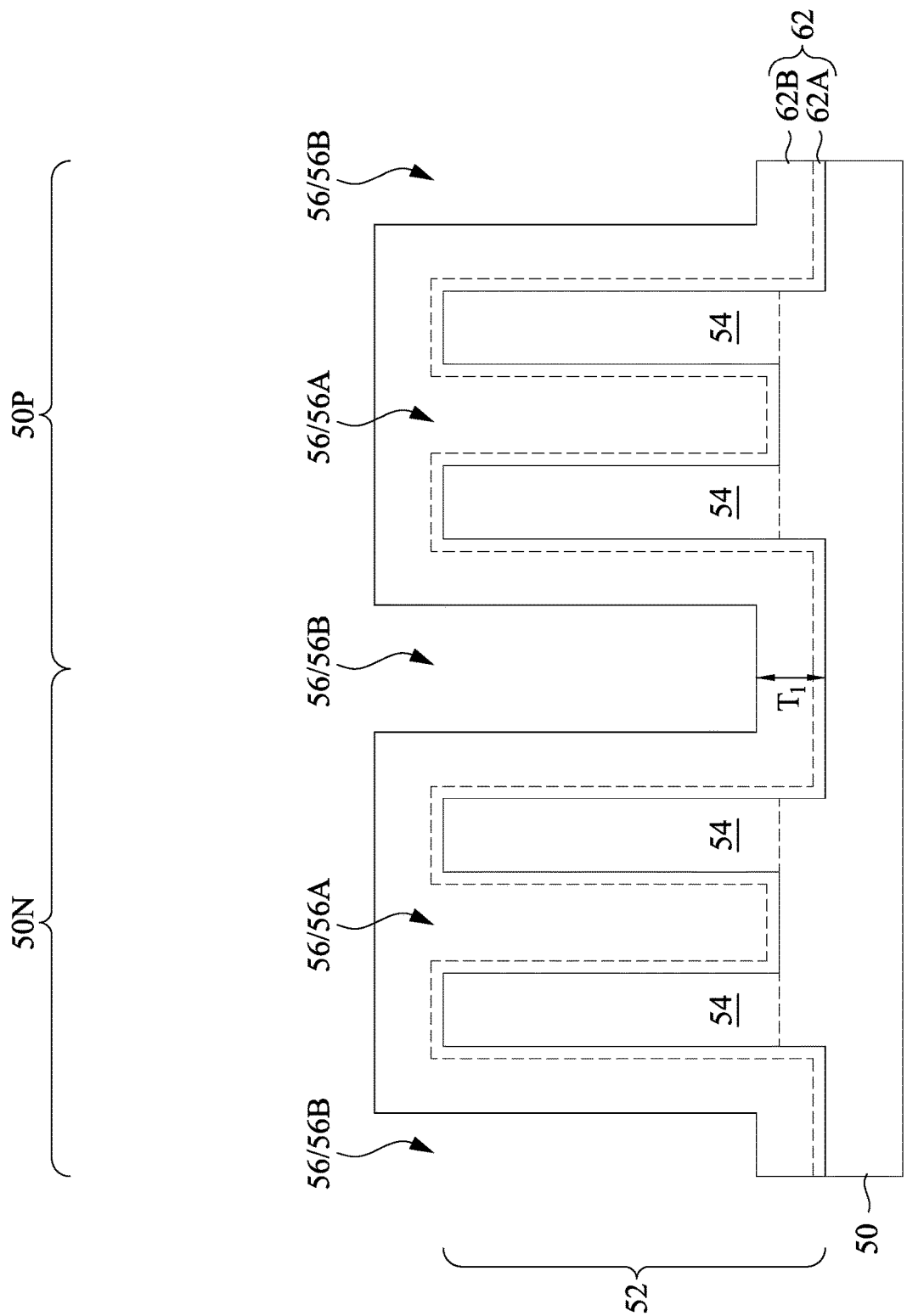

In FIG. 4, one or more layer(s) of insulation material 62 for isolation regions are formed over the substrate 50 and between adjacent semiconductor fins 54. The insulation material 62 may include an oxide, such as silicon oxide, a nitride, such as silicon nitride, the like, or a combination thereof, and may be formed by chemical vapor deposition (CVD), a high-density plasma chemical vapor deposition (HDP-CVD), a flowable CVD (FCVD), atomic layer deposition (ALD), the like, or a combination thereof. Other insulation materials formed by any acceptable process may be used. In the illustrated embodiment, the insulation material 62 includes a liner 62A on surfaces of the substrate 50 and the semiconductor fins 54, and a fill material 62B on the liner 62A. The liner 62A may be amorphous silicon, silicon oxide, silicon nitride, or the like conformally deposited with a conformal deposition process such as ALD, and the fill material 62B may be silicon oxide grown with a conformal growth process such as FCVD. In another embodiment, a single layer of insulation material 62 is formed. An anneal process may be performed once the insulation material is formed. The anneal process may be performed in an environment containing $H_2$ or $O_2$. The liner 62A can be oxidized by the anneal process so that after annealing, the liner 62A is a similar material as the fill material 62B. In an embodiment, the insulation material 62 is formed such that excess insulation material 62 covers the semiconductor fins 54.

The thickness of the insulation material 62 is controlled so that the insulation material 62 does not fill all of the trenches 56. In some embodiments, the insulation material 62 is deposited to a thickness $T_1$ in the range of 5 nm to 30 nm. The distances $D_1$, $D_2$ (see FIG. 3) and the thickness $T_1$ are controlled so that the insulation material 62 fills the trenches 56A without filling the trenches 56B. For example, the dispensed volume of the insulation material 62 may be sufficient to completely fill (or overfill) the trenches 56A, but may be insufficient to completely fill the trenches 56B. The insulation material 62 in the trenches 56B thus does not completely fill the trenches 56B, but instead conformally lines the surfaces of the substrate 50 and the sidewalls of the semiconductor fins 54 that define the trenches 56B.

In the illustrated embodiment, the sidewalls of the semiconductor fins 54 and the insulation material 62 are illustrated as forming right angles with the top surfaces of the substrate 50 and the insulation material 62, respectively. In other embodiments contouring may occur during the patterning of the semiconductor fins 54 and the deposition of the insulation material 62. Accordingly, rounded surfaces may connect the sidewalls of the semiconductor fins 54 to the top surfaces of the substrate 50, and rounded surfaces may connect the sidewalls of the insulation material 62 to the top surfaces of the insulation material 62.

Figure 5:
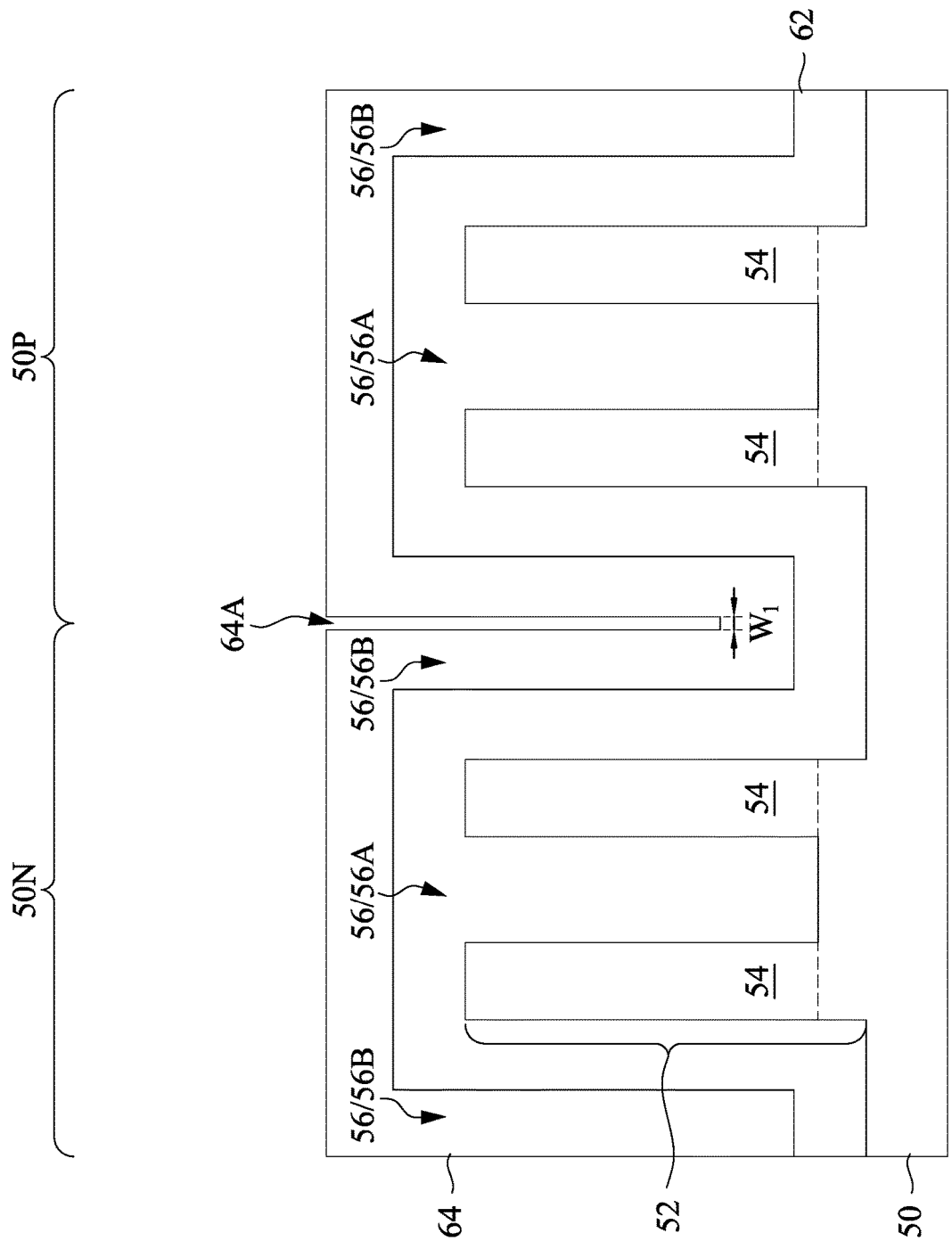

In FIG. 5, one or more dielectric layer(s) 64 are formed on the insulation material 62. The dielectric layer(s) 64 fill (and may overfill) the remaining portions of the trenches 56B that are not filled (e.g., are unoccupied) by the insulation material 62. In some embodiments, the dielectric layer(s) 64 merge in the trenches 56B and form seams or voids 64A in the trenches 56B. The seams 64A may have a width $W_1$ in a range from 1 to 3 nm. The dielectric layer(s) 64 may be formed of one or more dielectric material(s). Acceptable dielectric materials include nitrides (e.g., silicon nitride), oxides (e.g., tantalum oxide, aluminum oxide, zirconium oxide, hafnium oxide, etc.), carbides (e.g., silicon carbonitride, silicon oxycarbonitride, etc.), combinations thereof, or the like, which may be deposited by ALD, CVD, or the like. Other insulation materials formed by any acceptable process may be used. Further, the dielectric layer(s) 64 may be formed of a low-k dielectric material (e.g., a dielectric material having a k-value less than about 3.5), a high-k dielectric material (e.g., a dielectric material having a k-value greater than about 7.0), or multi-layers thereof. The dielectric layer(s) 64 are formed of material(s) that have a high etching selectivity from the etching of the insulation material 62. In some embodiments, the dielectric layer(s) 64 include silicon nitride formed by ALD.

Figure 6:
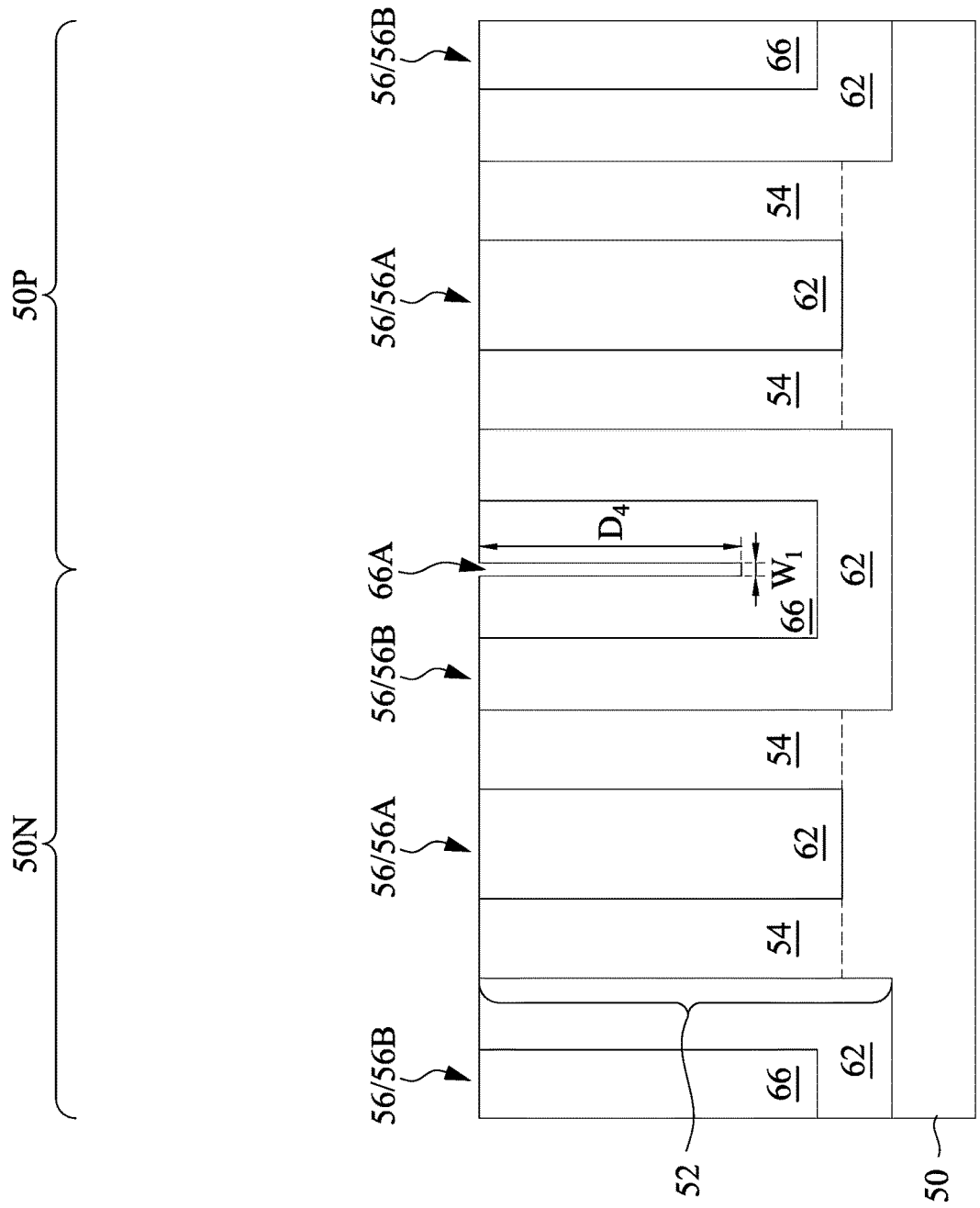

In FIG. 6, a removal process is applied to the dielectric layer(s) 64 and the insulation material 62 to remove excess portions of the dielectric layer(s) 64 and the insulation material 62 over the semiconductor fins 54 (e.g., outside of the trenches 56), thereby forming hybrid fins 66 including seams or voids 66A on the insulation material 62. In some embodiments, a planarization process such as a chemical mechanical polish (CMP), an etch-back process, combinations thereof, or the like may be utilized. The dielectric layer(s) 64, after the removal process, have portions left in the trenches 56B (thus forming the hybrid fins 66). After the planarization process, the top surfaces of the hybrid fins 66, the insulation material 62, and the semiconductor fins 54 are coplanar (within process variations) such that they are level with each other. The hybrid fins 66 are disposed between and are adjacent to the fin structures 52. In some embodiments, after the planarization process, the seams 66A of the hybrid fins 66 have a depth $D_4$ in the range of 60 nm to 70 nm. The hybrid fins 66 may also be referred to as "dielectric fins."

Figure 7:
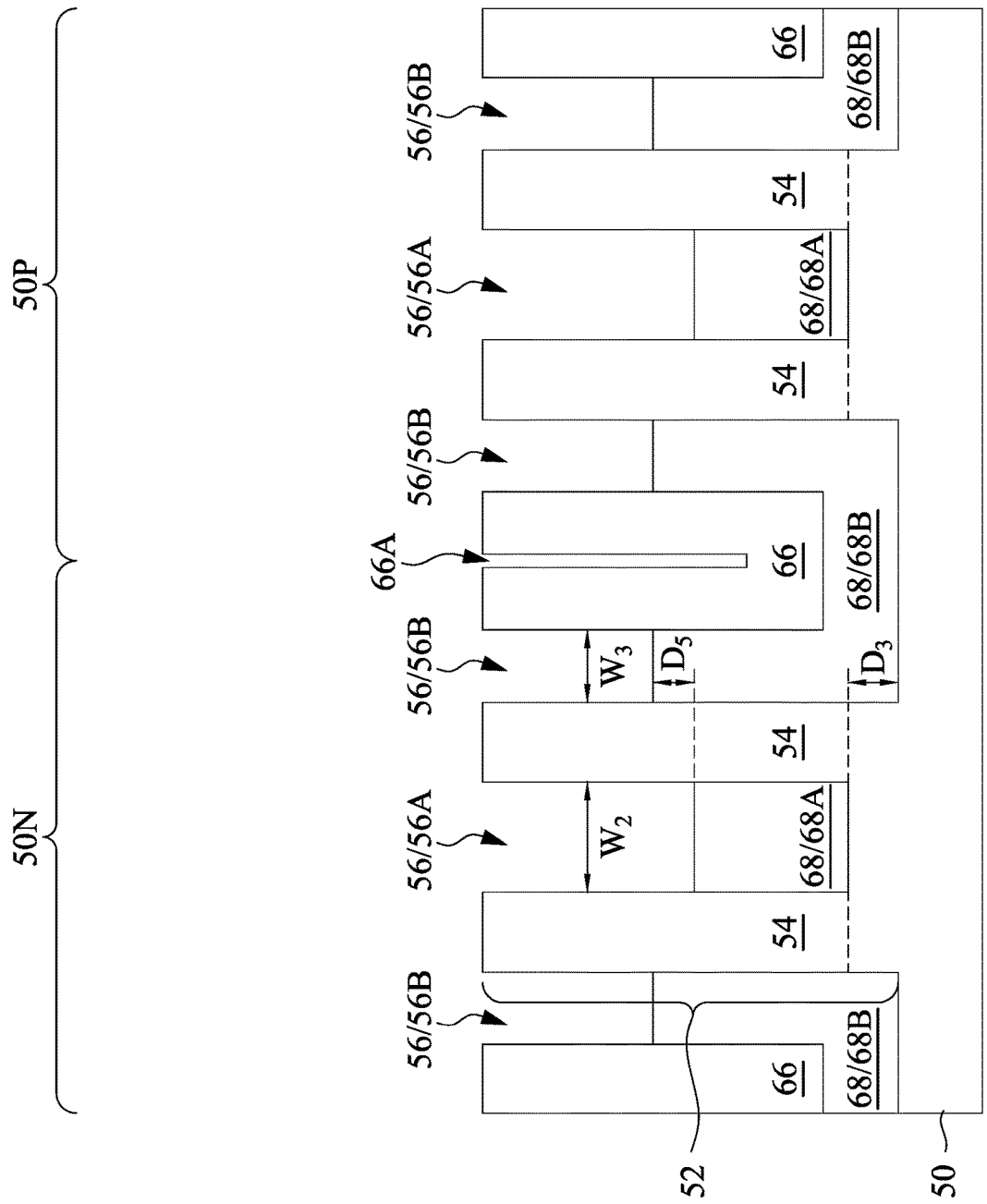

In FIG. 7, the insulation material 62 is recessed to form STI regions 68. The insulation material 62 is recessed such that upper portions of the semiconductor fins 54 and the hybrid fins 66 protrude above and from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material(s) of the insulation material 62. As will be subsequently described in greater detail, the etching process selectively etches the material(s) of the insulation material 62 at a faster rate than the materials of the semiconductor fins 54 and the hybrid fins 66. The semiconductor fins 54 and the hybrid fins 66 may thus be protected from damage during formation of the STI regions 68. Timed etch processes may be used to stop the etching of the insulation material 62 after the STI regions 68 reach a desired height. In some embodiments, the STI regions 68 have a height in the range of 10 nm to 100 nm. The STI regions 68 include the remaining portions of the insulation material 62 in the trenches 56.

As previously noted, the trenches 56B are deeper than the trenches 56A. As a result, the STI regions 68 have different heights. Specifically, a first subset of the STI regions 68A have a lesser height than a second subset of the STI regions 68B. The STI regions 68A are in the trenches 56A and between and among the semiconductor fins 54 of respective fin structures 52, and may be referred to as "inner STI regions." The STI regions 68B are in the trenches 56B and between adjacent fin structures 52 and around the hybrid fins 66 (e.g., between the semiconductor fins 54 and the hybrid fins 66), and may be referred to as "outer STI regions." Because the trenches 56B are deeper than the trenches 56A, the bottom surfaces of the STI regions 68B are disposed further from the top surfaces of the semiconductor fins 54 and the hybrid fins 66 than the bottom surfaces of the STI regions 68A. In some embodiments, the bottom surfaces of the STI regions 68B are disposed further from the top surfaces of the semiconductor fins 54 and the hybrid fins 66 than the bottom surfaces of the STI regions 68A by the distance $D_3$ (previously described).

Forming the STI regions 68 reforms portions of the trenches 56A, 56B. The reformed portions of the trenches 56A are between respective pairs of the semiconductor fins 54, and the reformed portions of the trenches 56B are between respective pairs of a semiconductor fin 54 and a hybrid fin 66. The distances $D_1$, $D_2$ (see FIG. 3) and the thickness $T_1$ (see FIG. 4) are controlled so that the reformed portions of the trenches 56A are wider than the reformed portions of the trenches 56B. In some embodiments, the reformed portions of the trenches 56A have a width $W_1$ in the range of 10 nm to 30 nm, the reformed portions of the trenches 56B have a width $W_2$ in the range of 5 nm to 20 nm, and the width $W_1$ is greater than the width $W_2$.

The insulation material 62 may be recessed by different amounts as a result of pattern loading effects during recessing of the insulation material 62, with the pattern loading effects caused by the reformed portions of the trenches 56A, 56B having different widths. In some embodiments, the etching of the insulation material 62 is performed with etching parameters (e.g., temperature, pressure, and duration) that exacerbate the pattern loading effects. As a result of the pattern loading effects, the portions of the insulation material 62 in the trenches 56A are recessed more (e.g., by a greater depth) than the portions of the insulation material 62 in the trenches 56B. Thus, the top surfaces of the STI regions 68B are disposed further from the substrate 50 than the top surfaces of the STI regions 68A. In other words, the STI regions 68B extend above the STI regions 68A, with respect to the substrate 50. In some embodiments, the top surfaces of the STI regions 68B are disposed further from the substrate 50 than the top surfaces of the STI regions 68A by a distance $D_5$ in the range of 2 nm to 10 nm.

In some embodiments where the insulation material 62 includes silicon oxide, the insulation material 62 is recessed by a dry etch using hydrofluoric (HF) acid and ammonia ($NH_3$). Each STI region 68B extends along three sides (e.g., the sidewalls and the bottom surface) of a hybrid fin 66. Specifically, a first portion of an STI region 68B is between a hybrid fin 66 and a first fin structure 52, a second portion of the STI region 68B is between the hybrid fin 66 and a second fin structure 52, and a third portion of the STI region 68B is beneath the hybrid fin 66.

The process described for FIGS. 2-7 is just one example of how the semiconductor fins 54, the hybrid fins 66, and the STI regions 68 may be formed. In some embodiments, the semiconductor fins 54 and/or the hybrid fins 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in some of the trenches, insulating structures can be deposited in others of the trenches, and the dielectric layer can be recessed (in a similar manner as described for FIG. 7) such that the epitaxial structures protrude from the dielectric layer to form the semiconductor fins 54 and the insulating structures protrude from the dielectric layer to form the hybrid fins 66. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the semiconductor fins 54 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the semiconductor fins 54 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the semiconductor fins 54, the hybrid fins 66, and the STI regions 68 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ $cm^{-3}$ to $10^{14}$ $cm^{-3}$. After the implant, the photoresist is removed, such as by any acceptable ashing process.

Following or prior to the implanting of the p-type region 50P, a mask (not separately illustrated) such as a photoresist is formed over the semiconductor fins 54, the hybrid fins 66, and the STI regions 68 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ $cm^{-3}$ to $10^{14}$ $cm^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 54, the grown materials may be in situ doped during growth, which may obviate the implantations, although in situ and implantation doping may be used together.

Figure 8:
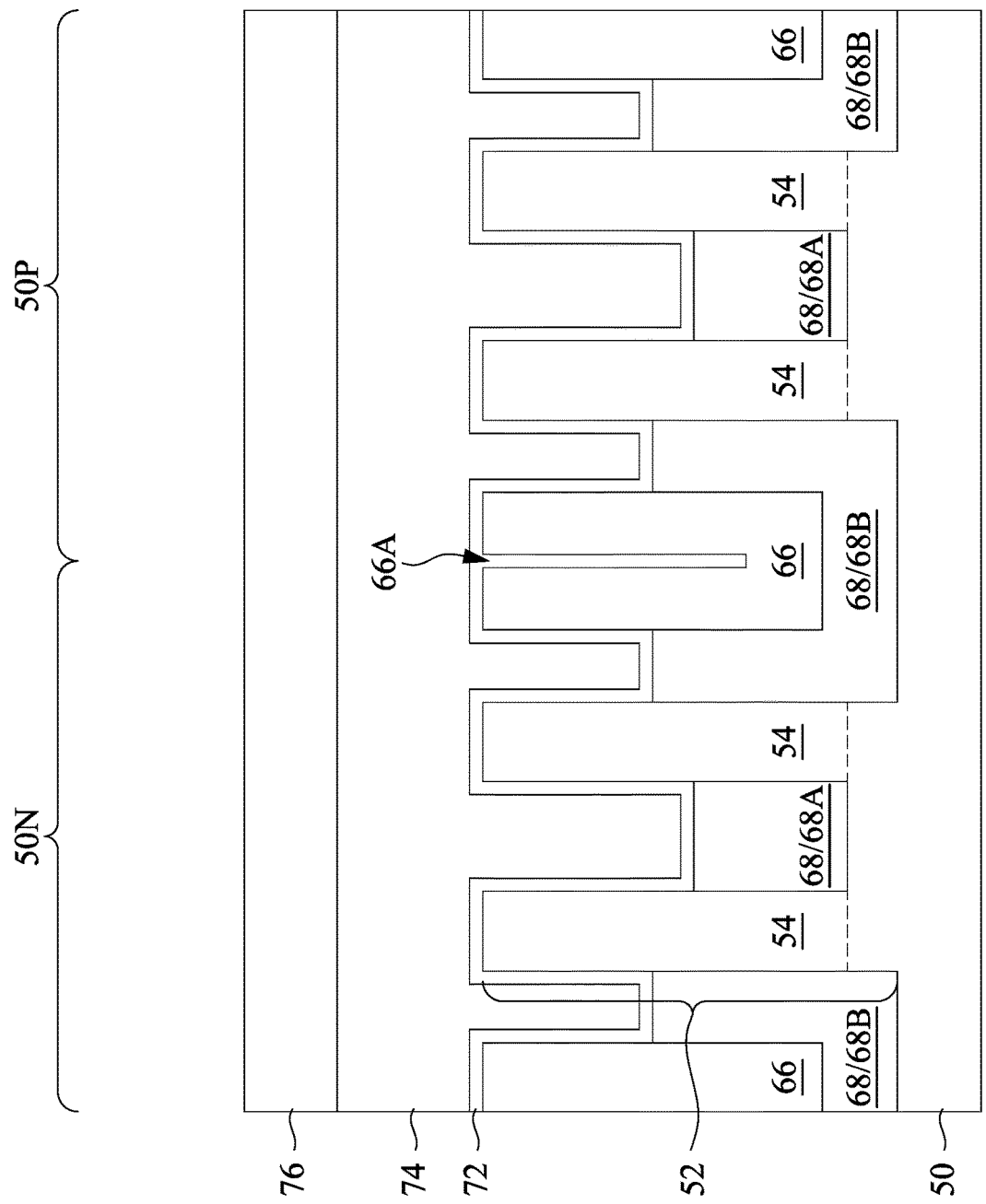

In FIG. 8, a dummy dielectric layer 72 is formed on the semiconductor fins 54, the hybrid fins 66, and within the seams 66A of the hybrid fins 66. The dummy dielectric layer 72 may be formed of a dielectric material such as silicon oxide, silicon nitride, a combination thereof, or the like, which may be deposited or thermally grown according to acceptable techniques such as ALD, in-situ steam growth (ISSG), rapid thermal oxidation (RTO), or the like. The dummy dielectric layer 72 may fill or substantially fill the seams 66A of the hybrid fins 66. The dummy dielectric layer 72 may also include or be referred to as an interfacial layer or interfacial oxide layer. In some embodiments, the dummy dielectric layer 72 has a thickness in the range of 1 nm to 10 nm. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 68 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the semiconductor fins 54, the hybrid fins 66, and the STI regions 68, such that the dummy dielectric layer 72 extends over the STI regions 68 and between the dummy gate layer 74 and the STI regions 68. In another embodiment, the dummy dielectric layer 72 covers only the semiconductor fins 54.

FIGS. 9A-18C illustrate various additional steps in the manufacturing of embodiment devices. FIGS. 9A-18C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 9B:
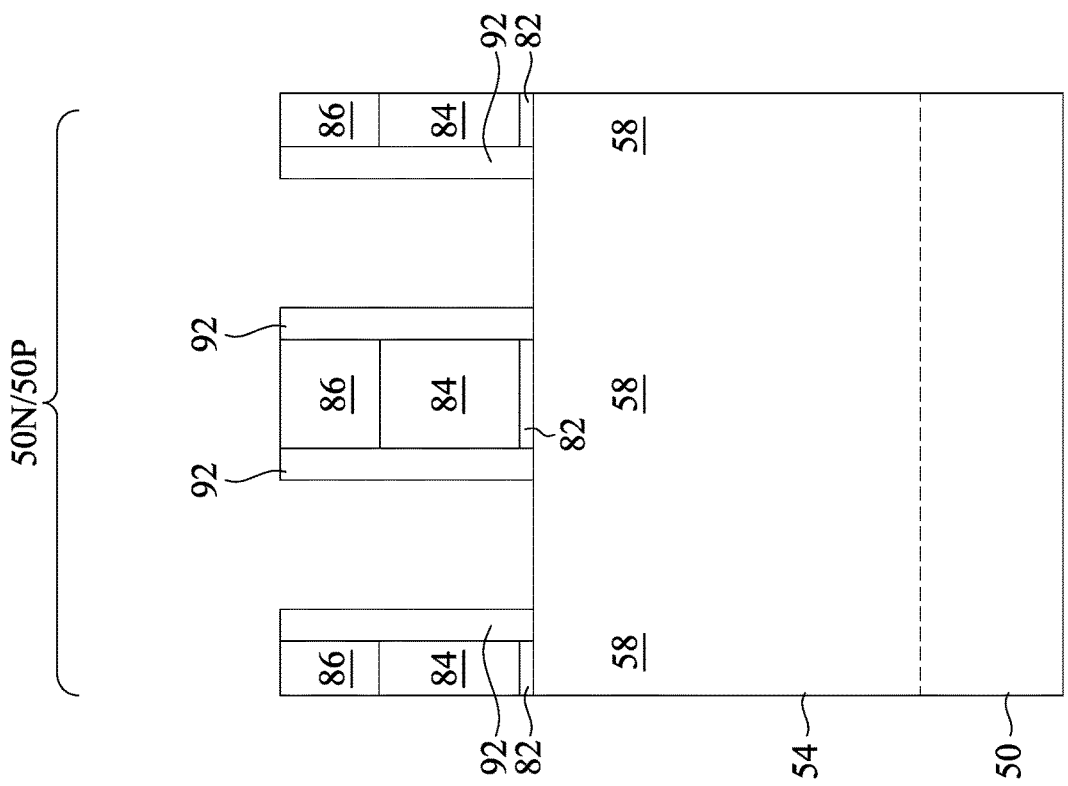
Figure 9A:
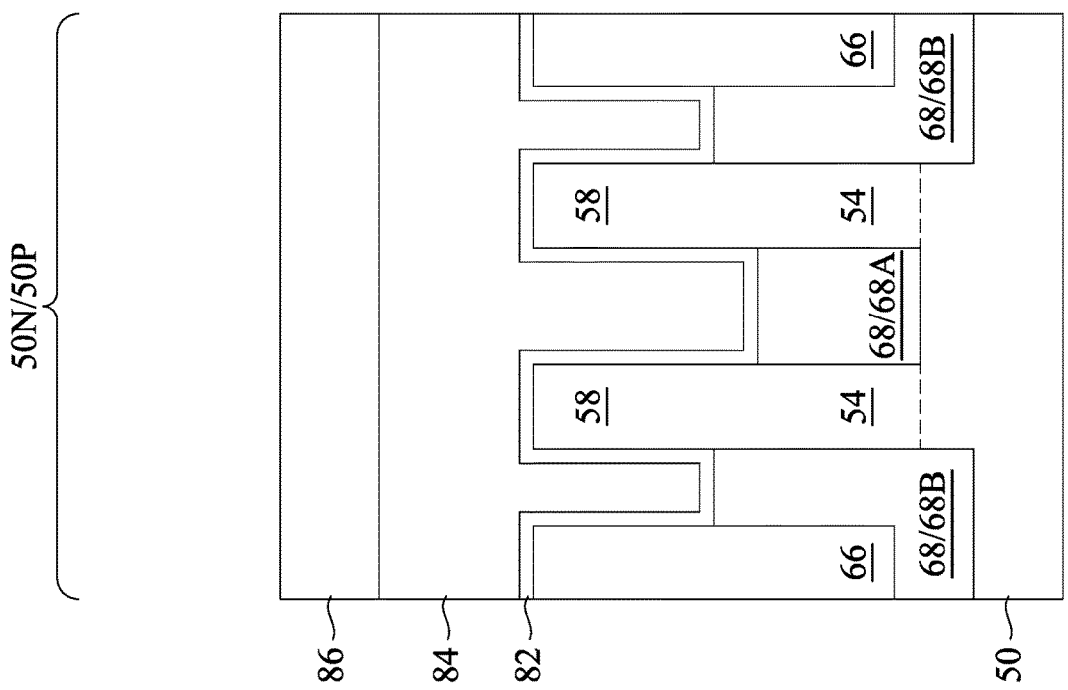
Figure 9C:
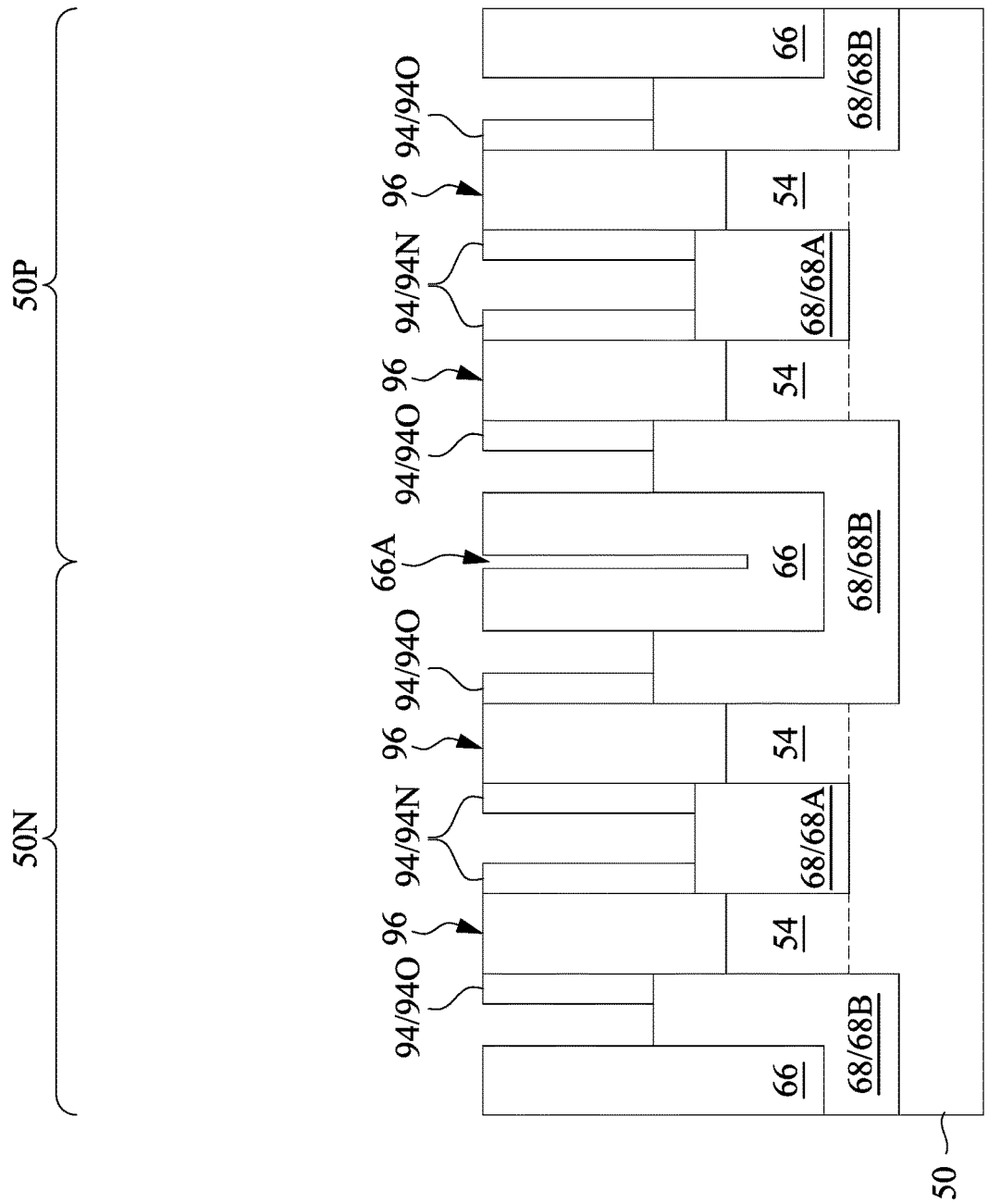

In FIG. 9A-9C, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover respective channel regions 58 of the semiconductor fins 54. The pattern of the masks 86 may be used to physically separate adjacent dummy gates 84. The dummy gates 84 may have lengthwise directions substantially perpendicular (within process variations) to the lengthwise directions of the semiconductor fins 54. The masks 86 may be removed during the patterning of the dummy gate 84, or may be removed during subsequent processing.

Gate spacers 92 are formed over the semiconductor fins 54, on exposed sidewalls of the masks 86 (if present), the dummy gates 84, and the dummy dielectrics 82. The gate spacers 92 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). In some embodiments the etch used to form the gate spacers 92 is adjusted so that the dielectric material(s), when etched, also have portions left on the sidewalls of the semiconductor fins 54 (thus forming fin spacers 94). After etching, the fin spacers 94 (if present) and the gate spacers 92 can have straight sidewalls (as illustrated) or can have curved sidewalls (not separately illustrated).

The fin spacers 94 include inner fin spacers 94N (disposed between the semiconductor fins 54 of a same fin structure 52, see FIG. 8) and outer fin spacers 94O (disposed between the semiconductor fins 54 and the hybrid fins 66). In the illustrated embodiments, the inner fin spacers 94N are separated after patterning, such that the STI regions 68A are exposed. In another embodiment, the inner fin spacers 94N are not completely separated, such that portions of the dielectric material(s) for the spacers remain over the STI regions 68A. Further, because the STI regions 68A have a lesser height than the STI regions 68B, the inner fin spacers 94N have a greater height than the outer fin spacers 94O.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 54 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 54 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 84, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 10B:
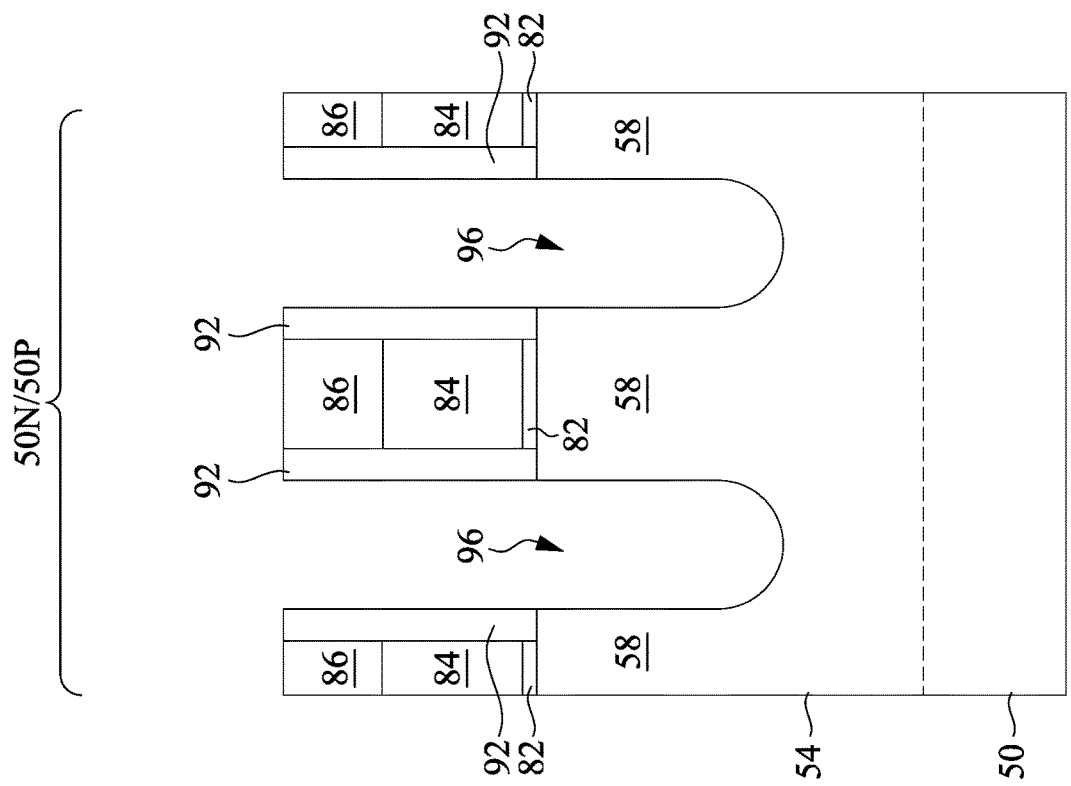
Figure 10A:
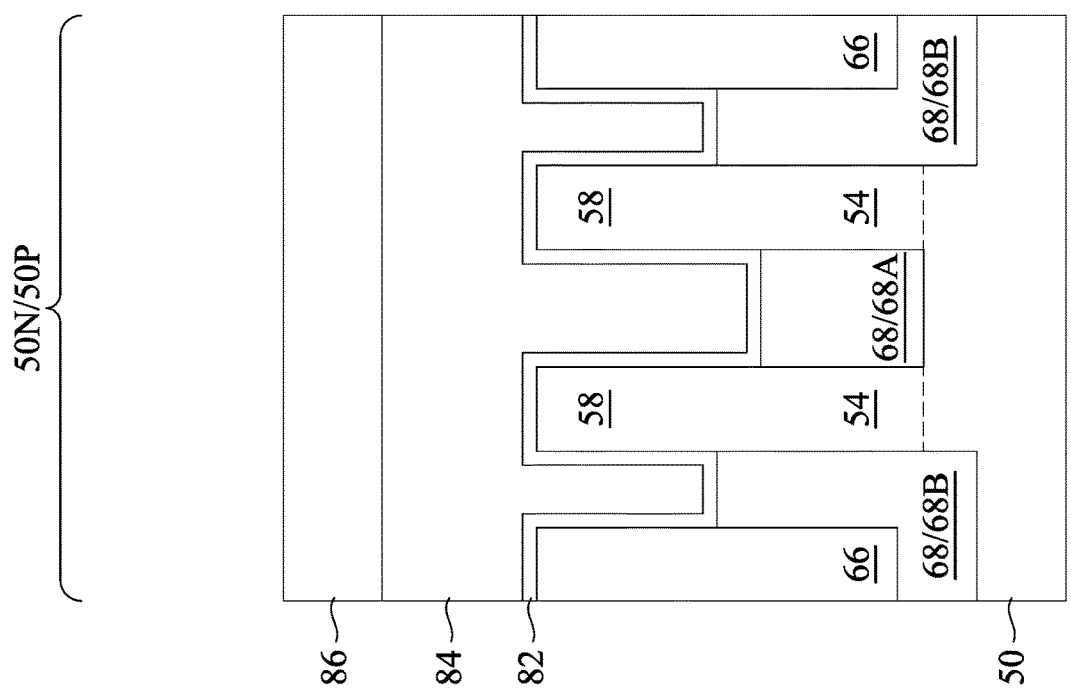
Figure 10C:
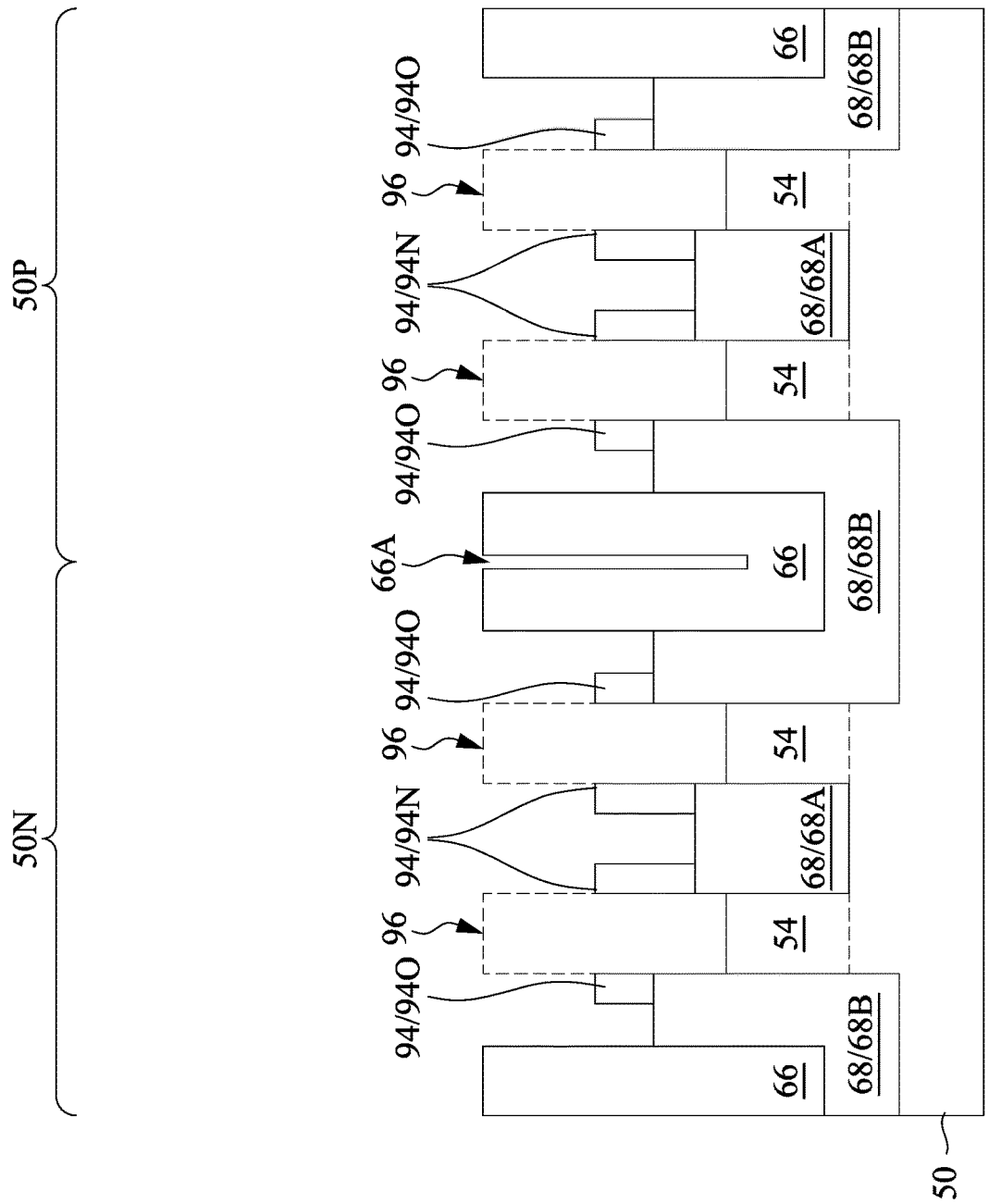

In FIGS. 10A-10C, source/drain recesses 96 are formed in the semiconductor fins 54. In the illustrated embodiment, the source/drain recesses 96 extend into the semiconductor fins 54. The source/drain recesses 96 may also extend into the substrate 50. In various embodiments, the source/drain recesses 96 may extend to a top surface of the substrate 50 without etching the substrate 50; the semiconductor fins 54 may be etched such that bottom surfaces of the source/drain recesses 96 are disposed below the top surfaces of the STI regions 68; or the like. The source/drain recesses 96 may be formed by etching the semiconductor fins 54 using an anisotropic etching process, such as a RIE, a NBE, or the like. The etching process selectively etches the material(s) of the semiconductor fins 54 at a faster rate than the materials of the hybrid fins 66 and the STI regions 68. The gate spacers 92 and the dummy gates 84 collectively mask portions of the semiconductor fins 54 during the etching processes used to form the source/drain recesses 96. Timed etch processes may be used to stop the etching of the source/drain recesses 96 after the source/drain recesses 96 reach a desired depth. The fin spacers 94 (if present) may be etched during or after the etching of the source/drain recesses 96, so that the height of the fin spacers 94 is reduced. The size and dimensions of the source/drain regions that will be subsequently formed in the source/drain recesses 96 may be controlled by adjusting the height of the fin spacers 94. The hybrid fins 66 are not recessed, and remain between the fin structures 52 are the source/drain recesses 96 are etched.

Figure 11B:
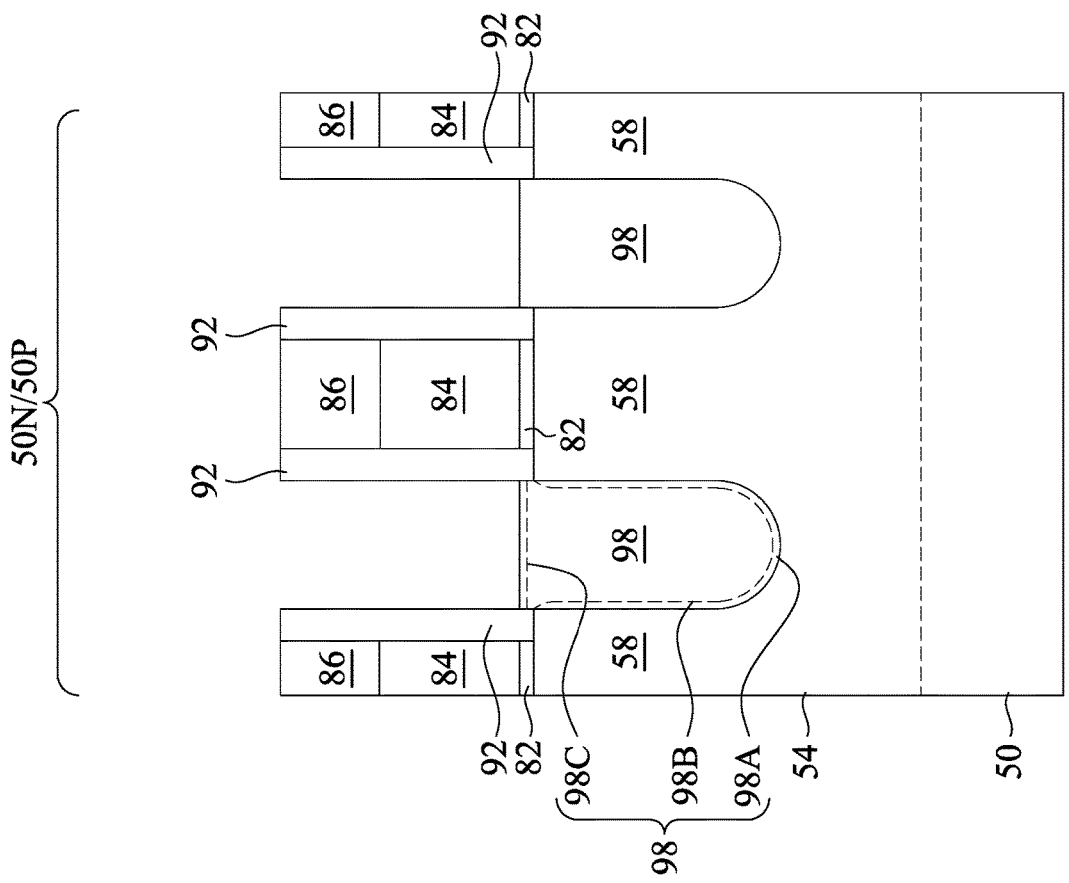
Figure 11A:
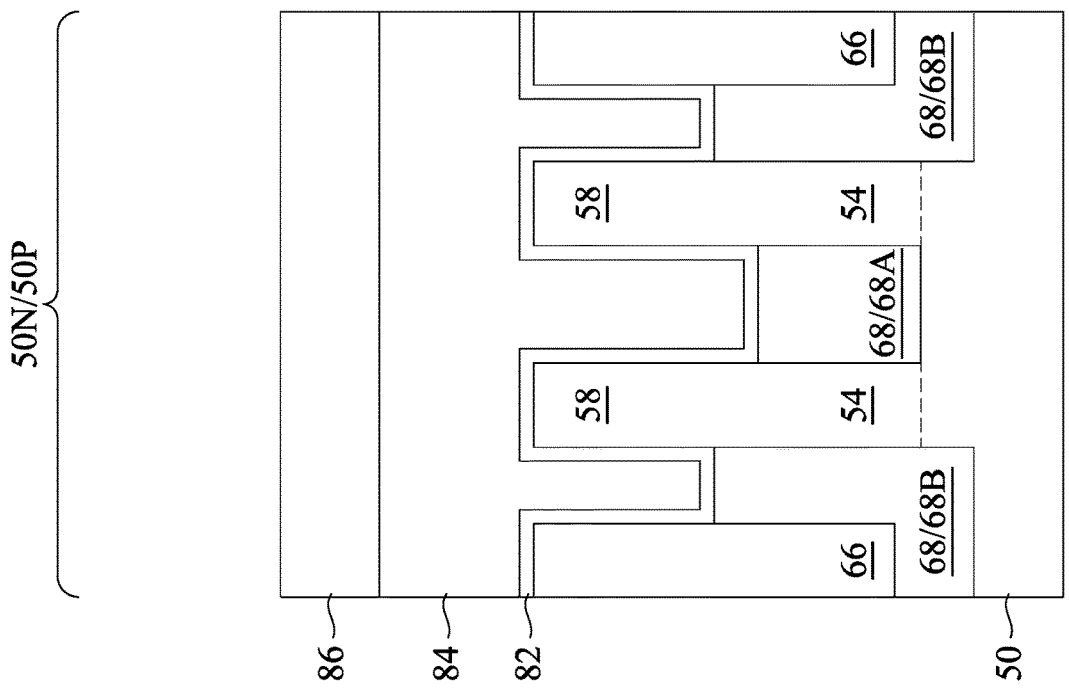
Figure 11C:
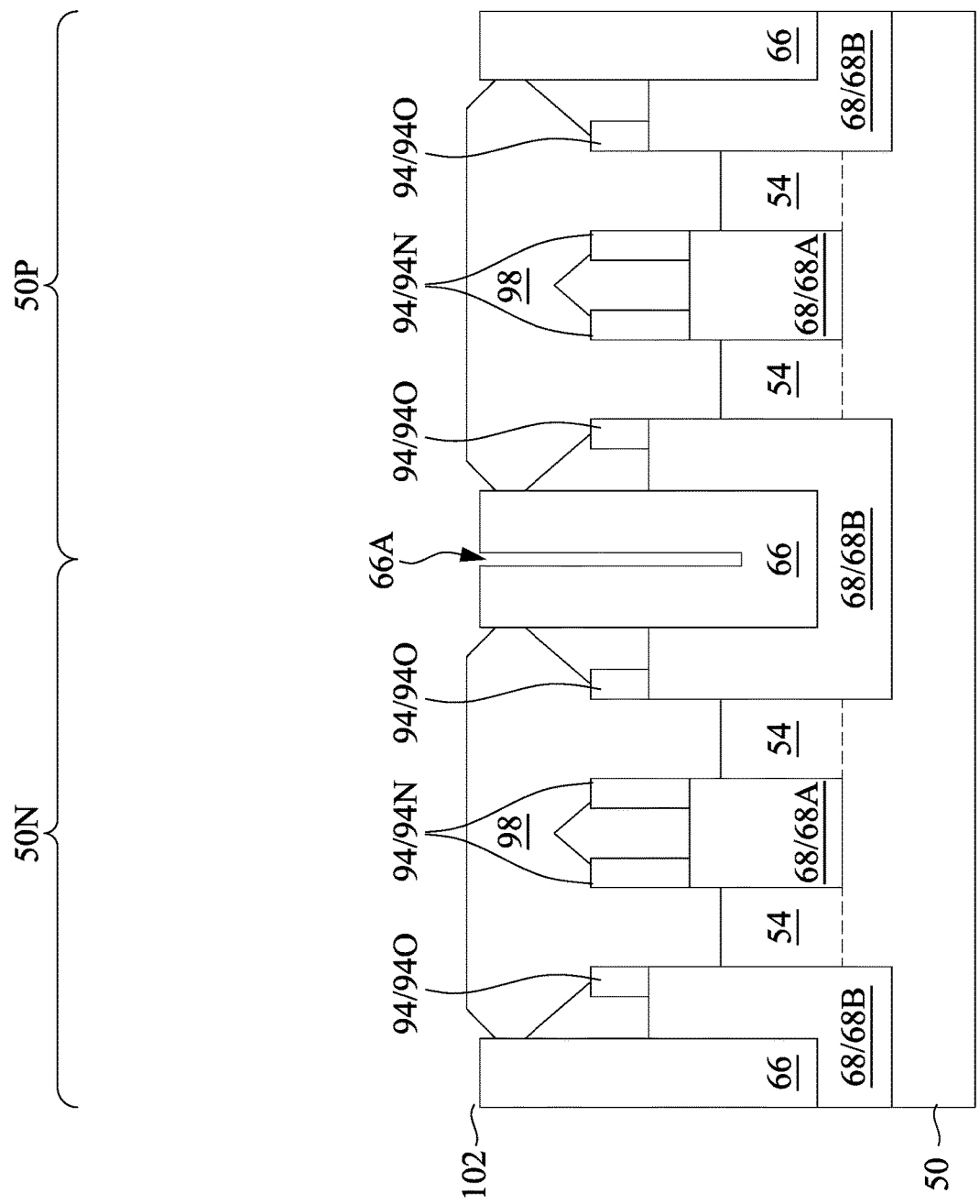

In FIGS. 11A-11C, epitaxial source/drain regions 98 are formed in the source/drain recesses 96. The epitaxial source/drain regions 98 are thus disposed in the semiconductor fins 54 such that each dummy gate 84 (and corresponding channel region 58) is between respective adjacent pairs of the epitaxial source/drain regions 98. The epitaxial source/drain regions 98 thus adjoin the channel regions 58. In some embodiments, the gate spacers 92 are used to separate the epitaxial source/drain regions 98 from the dummy gates 84 by an appropriate lateral distance so that the epitaxial source/drain regions 98 do not short out with subsequently formed gates of the resulting FinFETs. A material of the epitaxial source/drain regions 98 may be selected to exert stress in the respective channel regions 58, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 96 in the n-type region 50N. The epitaxial source/drain regions 98 may include any acceptable material appropriate for n-type devices. For example, if the semiconductor fins 54 are silicon, the epitaxial source/drain regions 98 in the n-type region 50N may include materials exerting a tensile strain on the channel regions 58, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the semiconductor fins 54 and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 96 in the p-type region 50P. The epitaxial source/drain regions 98 may include any acceptable material appropriate for p-type devices. For example, if the semiconductor fins 54 are silicon, the epitaxial source/drain regions 98 in the p-type region 50P may include materials exerting a compressive strain on the channel regions 58, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the semiconductor fins 54 and may have facets.

The epitaxial source/drain regions 98 and/or the semiconductor fins 54 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. In embodiments in which the epitaxial source/drain regions 98 include three semiconductor material layers, the liner layers 98A may be grown in the source/drain recesses 96, the main layers 98B may be grown on the liner layers 98A, and the finishing layers 98C may be grown on the main layers 98B. The liner layers 98A, the main layers 98B, and the finishing layers 98C may be formed of different semiconductor materials and may be doped to different impurity concentrations. In some embodiments, the main layers 98B have a greater concentration of impurities than the finishing layers 98C, and the finishing layers 98C have a greater concentration of impurities than the liner layers 98A. Forming the liner layers 98A with a lesser concentration of impurities than the main layers 98B may increase adhesion in the source/drain recesses 96, and forming the finishing layers 98C with a lesser concentration of impurities than the main layers 98B may reduce out-diffusion of dopants from the main layers 98B during subsequent processing.

As a result of the epitaxy processes used to form the epitaxial source/drain regions 98, upper surfaces of the epitaxial source/drain regions have facets which expand laterally outward beyond sidewalls of the semiconductor fins 54. In some embodiments, these facets cause adjacent epitaxial source/drain regions 98 to merge as illustrated by FIG. 11C. However, the hybrid fins 66 (where present) block the lateral epitaxial growth to prevent coalescing of some of the epitaxial source/drain regions 98. For example, the hybrid fins 66 may be formed at cell boundaries to separate the epitaxial source/drain regions 98 of adjacent cells. Therefore, some of the epitaxial source/drain regions 98 are separated by the hybrid fins 66. The epitaxial source/drain regions 98 may contact the sidewalls of the hybrid fins 66. In the illustrated embodiments, the fin spacers 94 are formed to cover a portion of the sidewalls of the semiconductor fins 54 that extend above the STI regions 68, thereby blocking the epitaxial growth. In another embodiment, the spacer etch used to form the gate spacers 92 is adjusted to not form the fin spacers 94, so as to allow the epitaxial source/drain regions 98 to extend to the surfaces of the STI regions 68.

The fin spacer 94 may maintain their relative heights after the fin spacers 94 are recessed (described for FIGS. 10A-10C) and the epitaxial source/drain regions 98 are grown (described for FIGS. 11A-11C), such that the inner fin spacers 94N still have a greater height than the outer fin spacers 94O. Accordingly, the outer fin spacers 94O over the STI regions 68B (between the hybrid fins 66 and the semiconductor fins 54) have a first height, the inner fin spacers 94N over the STI regions 68A (between the semiconductor fins 54) have a second height, and the second height greater than the first height. In some embodiments, the inner fin spacers 94N and the outer fin spacers 94O have a height in the range of 5 nm to 50 nm.

Figure 12B:
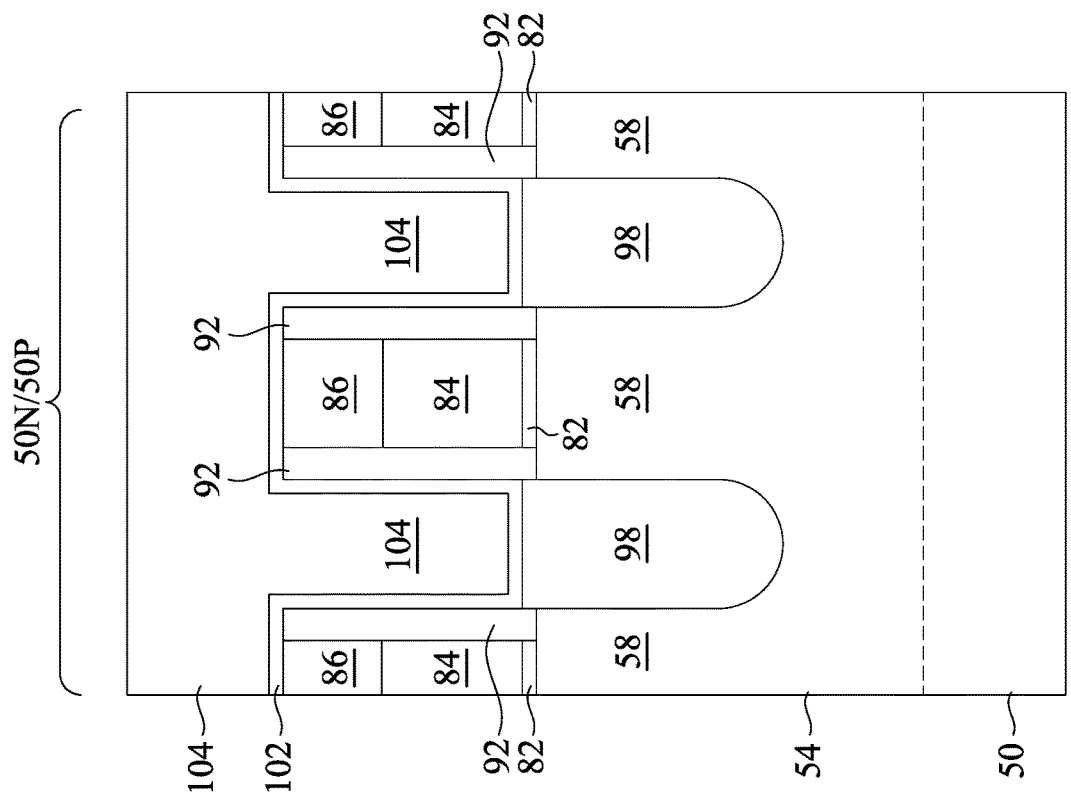
Figure 12A:
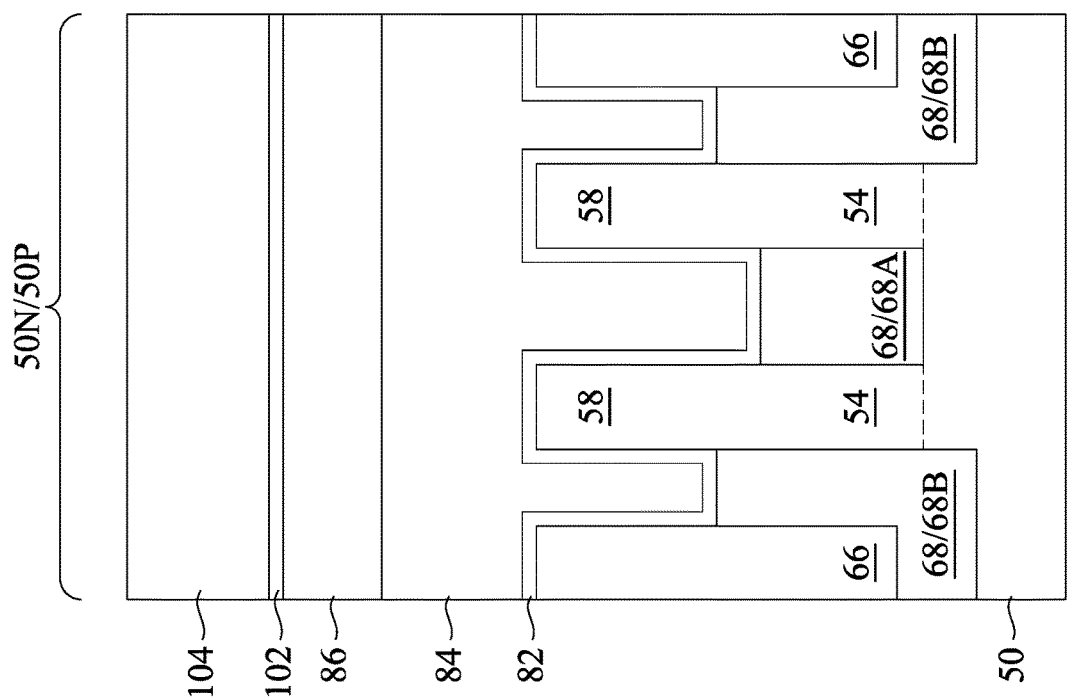
Figure 12C:
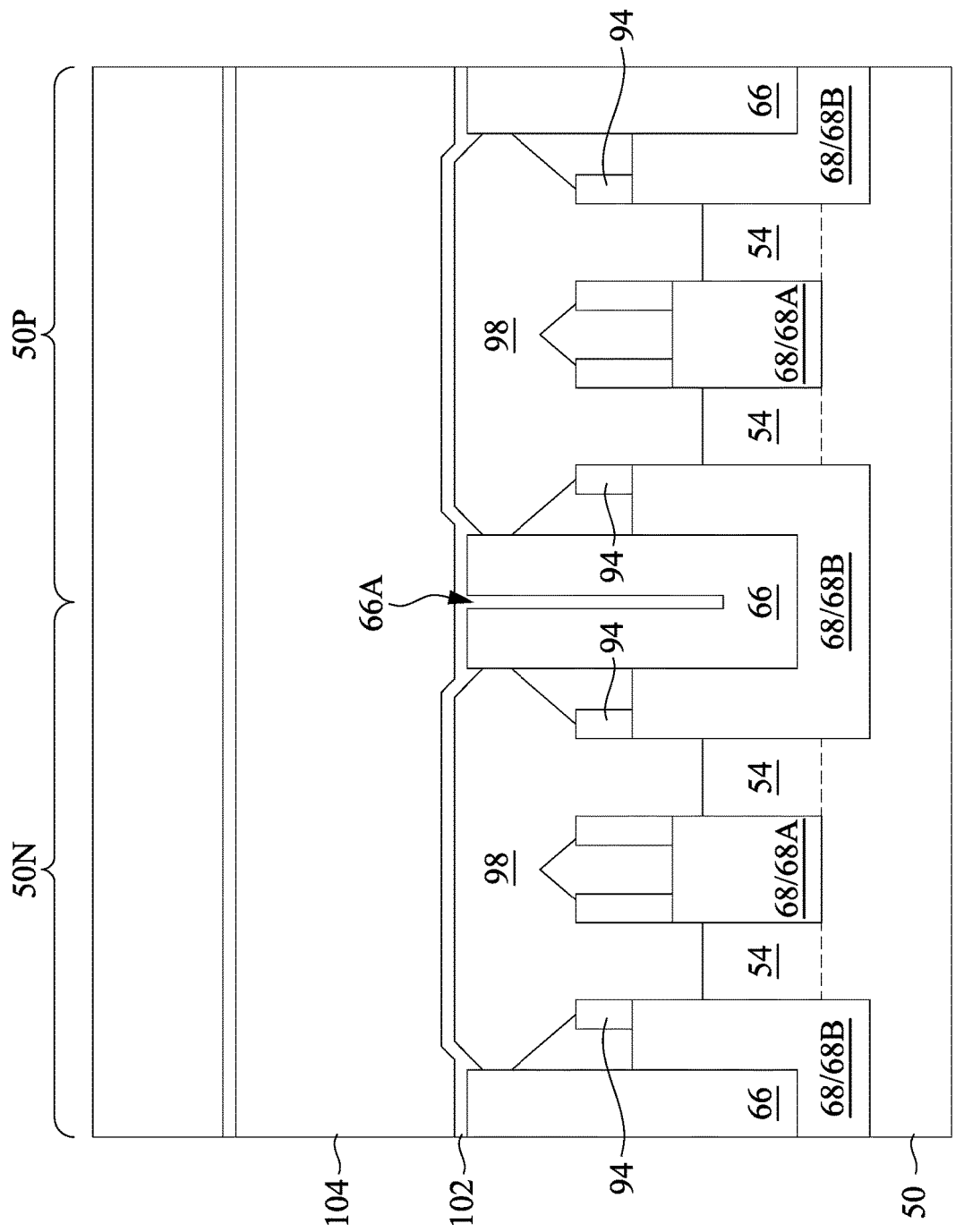

In FIGS. 12A-12C, a first inter-layer dielectric (ILD) 104 is deposited over the epitaxial source/drain regions 98, the gate spacers 92, the masks 86 (if present) or the dummy gates 84, and the hybrid fins 66. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 92, the masks 86 (if present) or the dummy gates 84, and the hybrid fins 66. In some embodiments, the CESL 102 fills or substantially fills the seams 66A of the hybrid fins 66 adjacent the source/drain regions 98 (see, e.g., FIG. 12C). The CESL 102 may be formed of a dielectric material, such as silicon nitride, silicon oxide, silicon oxynitride, or the like, having a high etching selectivity from the etching of the first ILD 104. The CESL 102 may be formed by any suitable method, such as CVD, ALD, or the like.

Figure 13B:
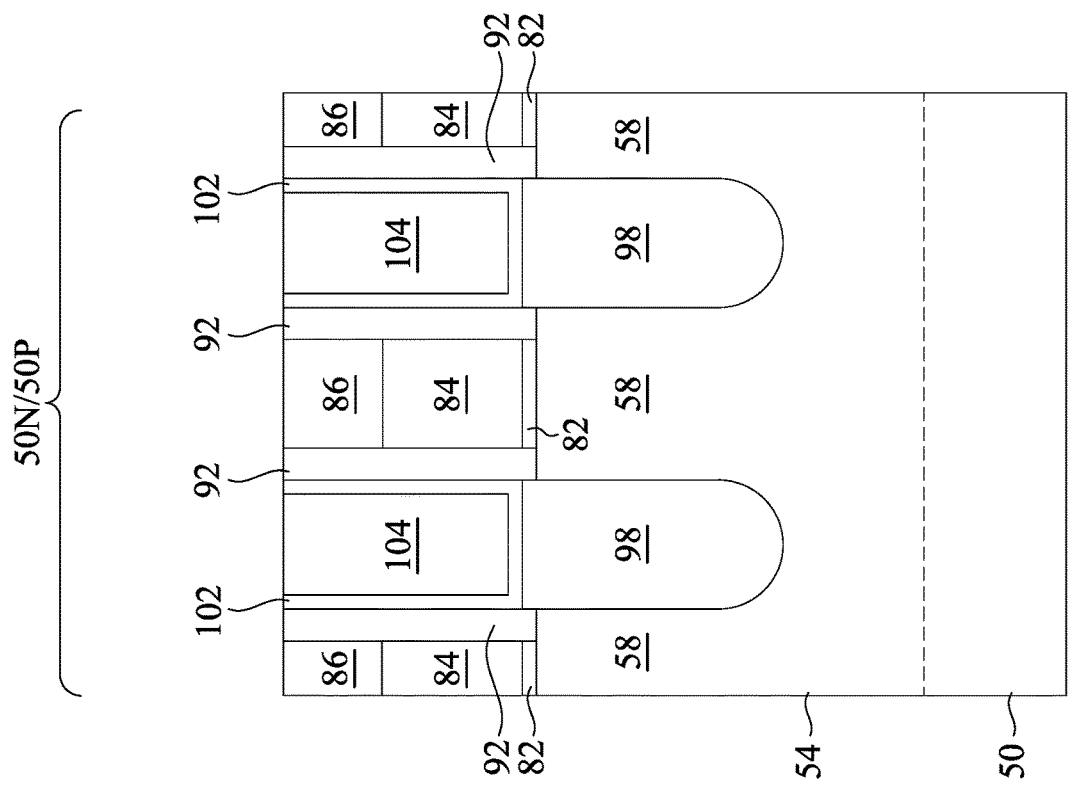
Figure 13A:
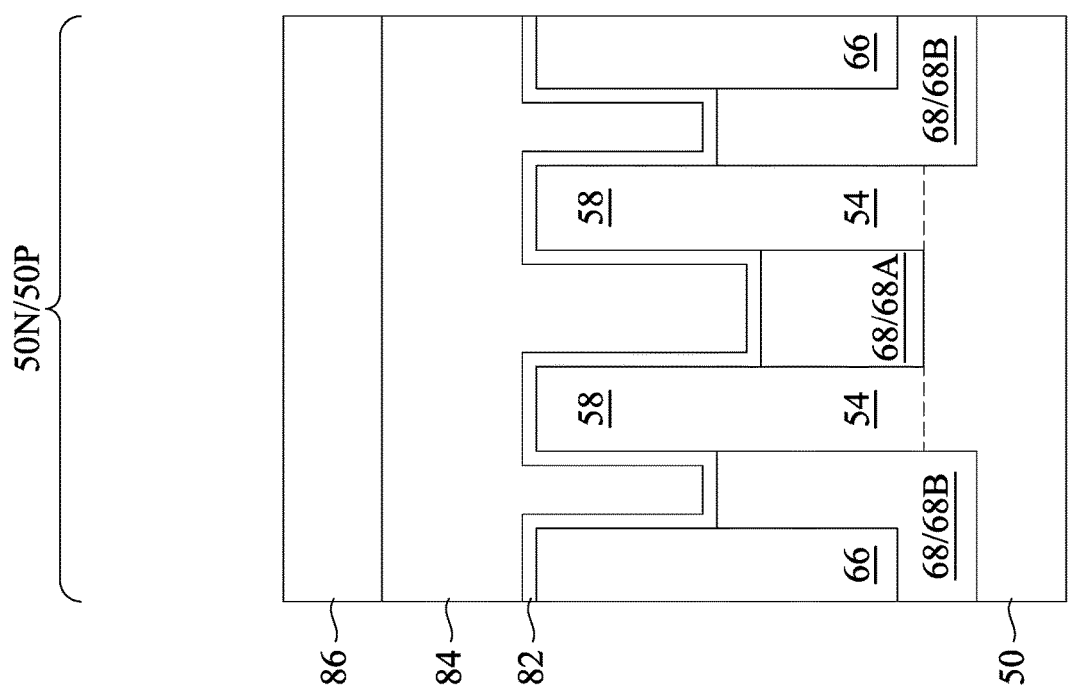
Figure 13C:
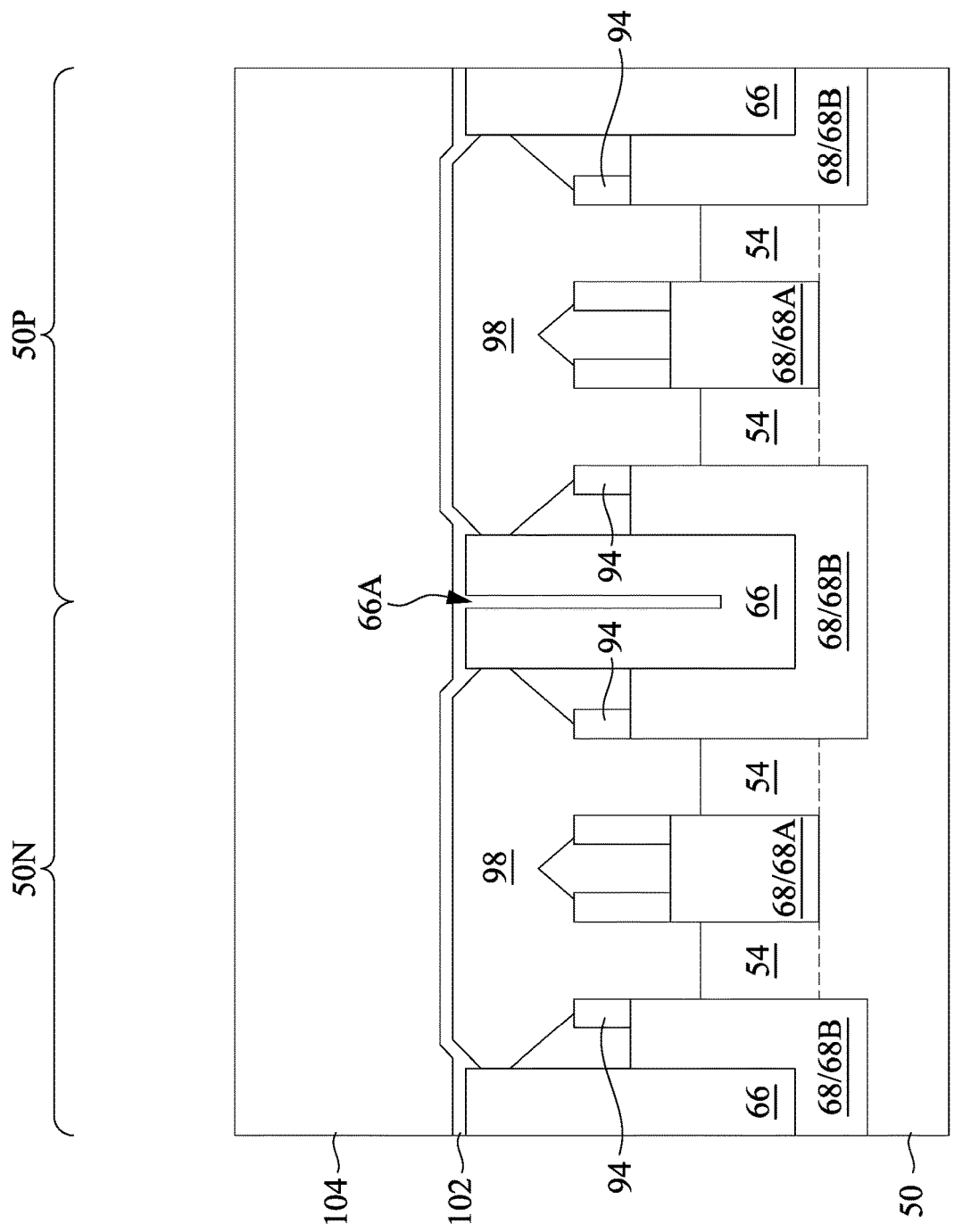

In FIGS. 13A-13C, a removal process is performed to level the top surfaces of the first ILD 104 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, the top surfaces of the first ILD 104, the CESL 102, the gate spacers 92, and the masks 86 (if present) or the dummy gates 84 are coplanar (within process variations) such that they are level with each other. Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 14A:
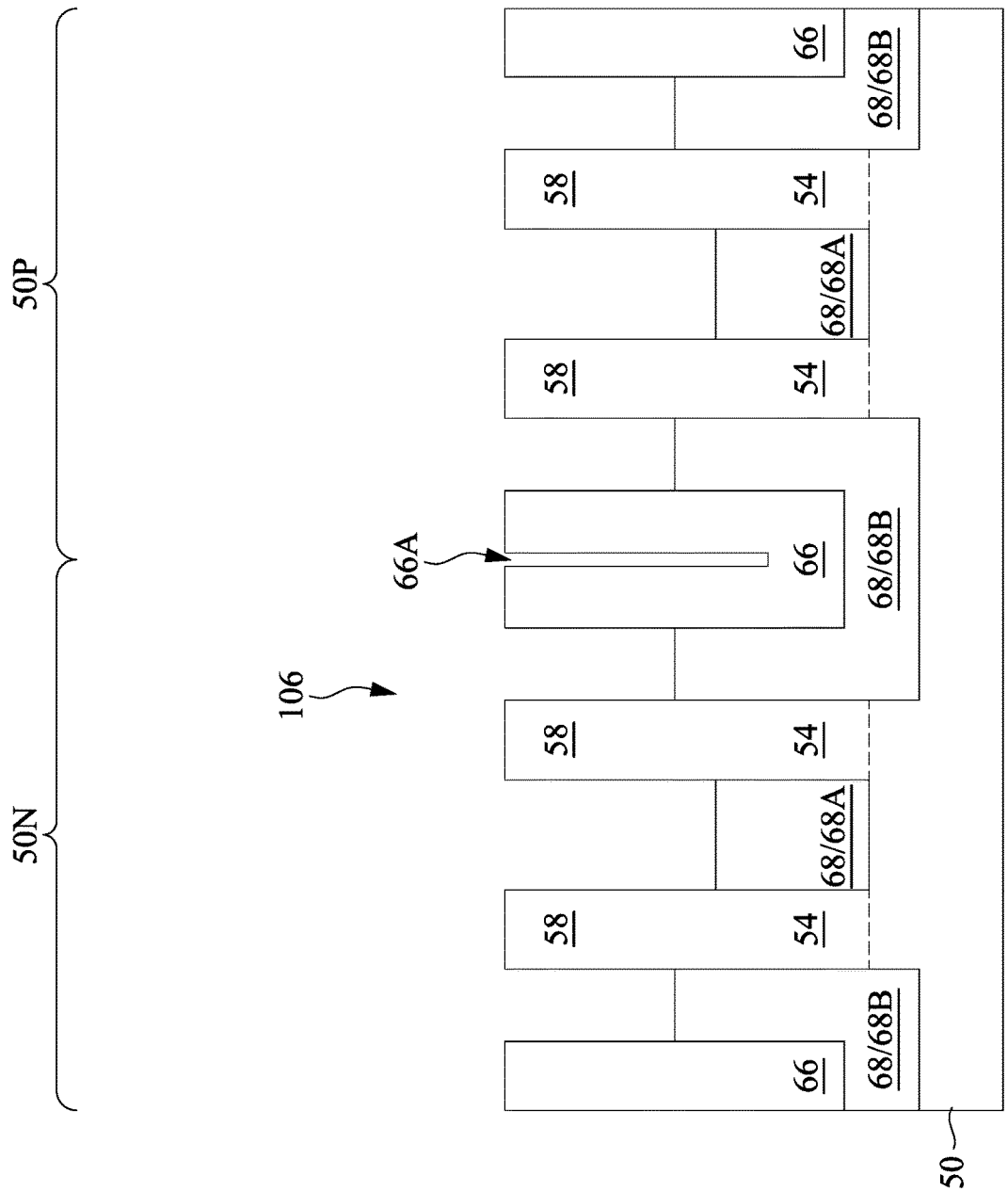
Figure 14B:
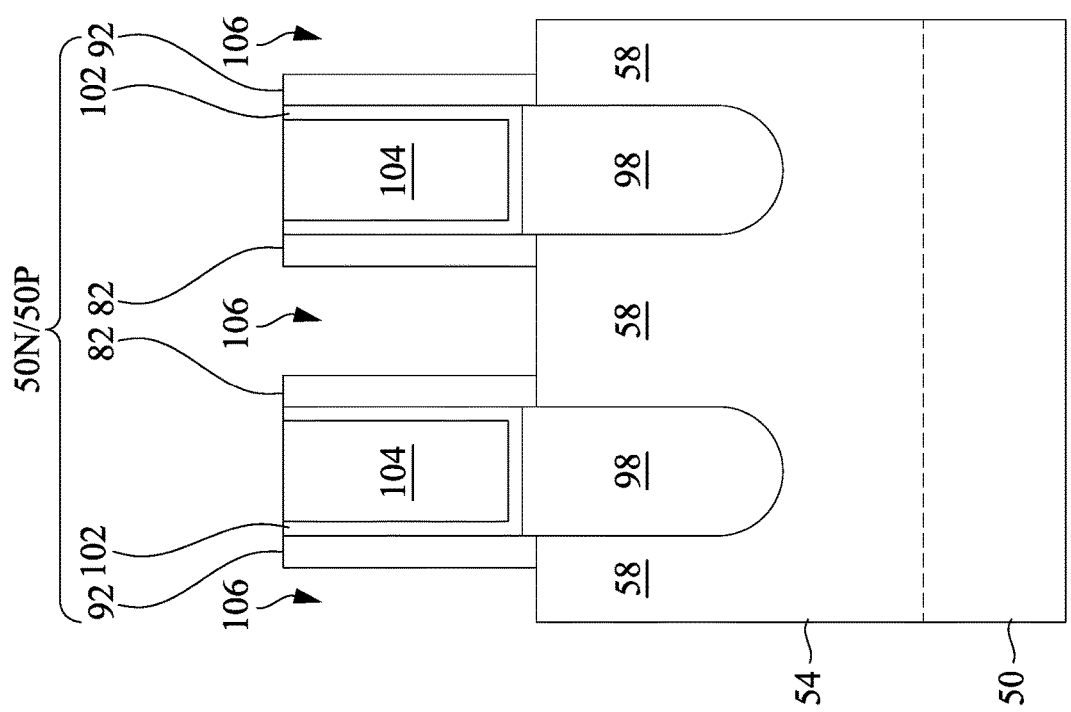
Figure 14C:
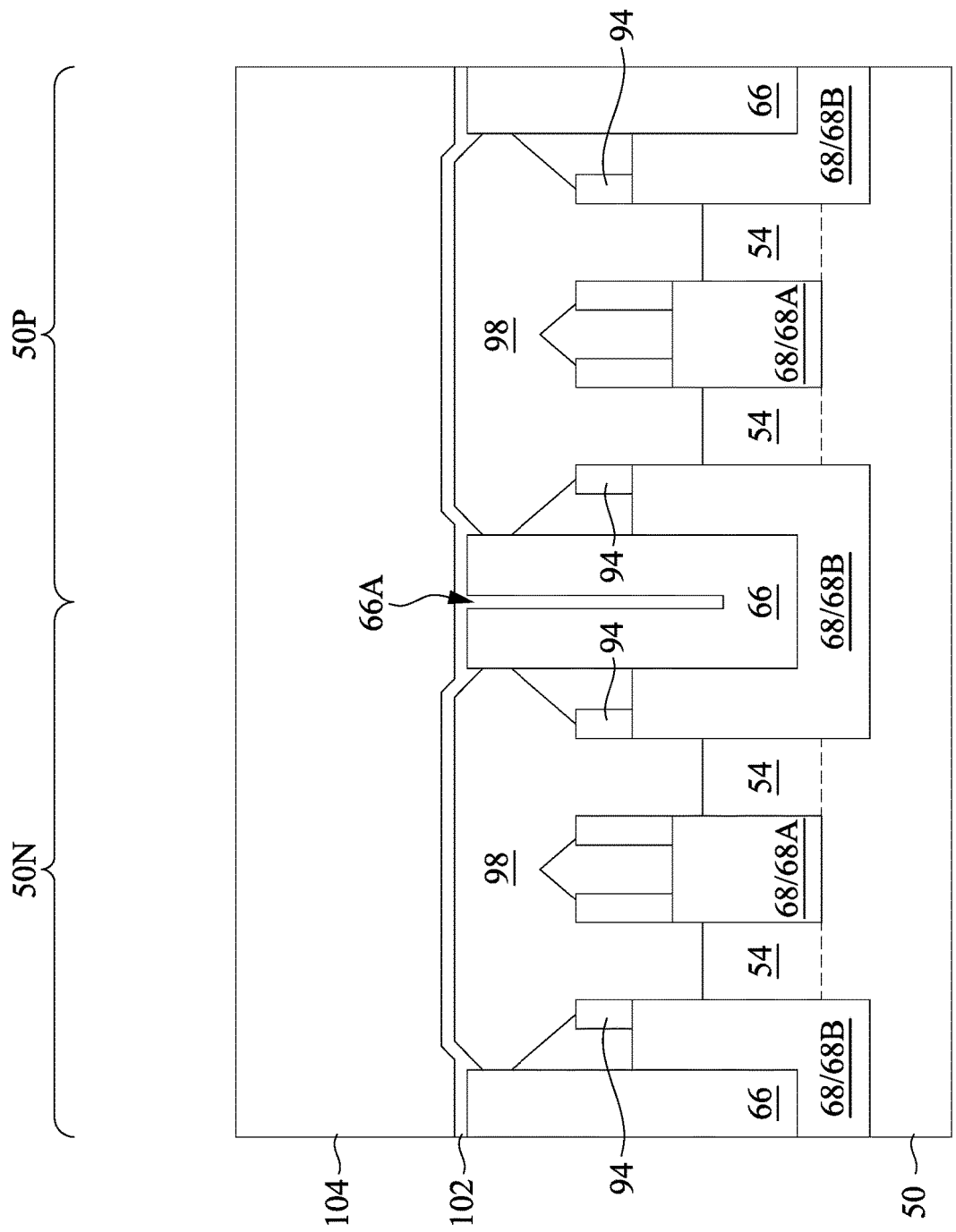

In FIGS. 14A-14C, the masks 86 (if present) and the dummy gates 84 and dummy dielectrics 82 are removed in an etching process, so that recesses 106 are formed. The removal process removes the dummy dielectrics 82 from the seams 66A of the hybrid fins 66 that were exposed with the removal of the dummy gates 84. In some embodiments, the dummy dielectrics 82 are removed from recesses 106 in a first region of a die (e.g., a core logic region) and remain in recesses 106 in a second region of the die (e.g., an input/output region). In some embodiments, the dummy gates 84 are removed by an anisotropic dry etch process. For example, the etching process may include a dry etch process using reaction gas(es) that selectively etch the material of the dummy gates 84 at a faster rate than the materials of the first ILD 104 and the gate spacers 92. During the removal, the dummy dielectrics 82 may be used as etch stop layers when the dummy gates 84 are etched. The dummy dielectrics 82 may then be removed after the removal of the dummy gates 84. In some embodiments, the dummy dielectrics 82 are removed by an anisotropic etch process. Each recess 106 exposes and/or overlies a channel region 58 of a respective semiconductor fin 54. The recesses 106 also expose the hybrid fins 66 and the seams 66A of the hybrid fins 66.

In FIGS. 15A-16C, gate dielectrics 112 and gate electrodes 114 are formed for replacement gates. Each respective pair of a gate dielectric 112 and a gate electrode 114 may be collectively referred to as a "gate structure." Each gate structure extends along sidewalls and a top surface of a channel region 58 of the semiconductor fins 54. Some of the gate structures further extend along sidewalls and a top surface of a hybrid fin 66.

The gate dielectrics 112 include two or more gate dielectric layer(s) 112A and 112B disposed in the recesses 106, such as on the top surfaces and the sidewalls of the semiconductor fins 54, on the top surfaces and the sidewalls of the hybrid fins 66, and on sidewalls of the gate spacers 92. The gate dielectric layer 112A may be referred to as an interfacial layer and may include an oxide such as silicon oxide or a metal oxide, a silicate such as a metal silicate, combinations thereof, multi-layers thereof, or the like. The gate dielectric layer 112A is formed to fill or substantially fill the seams 66A in the hybrid fins 66. The gate dielectric layer 112A is formed in the seams 66A by first soaking the structure in a silicon precursor followed by an oxidation process. In some embodiments, the silicon precursor includes $SiH_4$, $Si_2H_6$, LTO520 ($C_6H_{17}NSi$), SAM24 ($C_8H_{22}N_2Si$), the like, or a combination thereof. In some embodiments, the silicon precursor soaking process is performed at a temperature in a range from 350° C. to 490° C., for a time period in a range from 10 minutes to 30 minutes, and at a ratio of silicon precursor to carrier gas in a range from 5:1 to 10:1 with the carrier gas including $N_2$, $H_2$, or the like. Performing the silicon precursor soak with process conditions in these ranges followed by an oxidation process provides a sufficiently thin film (e.g., less than 10 Å), and the length, width, and height of the trench design between semiconductor fins 54 and hybrid fins 66 of the overall wafer structure is not affected.

In some embodiments, the oxidation process is an $O_3$ oxidation process. The gate dielectric layer 112A within the seams 66A of the hybrid fins 66 may have a different material composition than the gate dielectric layer 112A on the semiconductor fins 54. In some embodiments, the gate dielectric layer 112A within the seams 66A is more silicon-rich than the gate dielectric layer 112A outside of the seams 66A. For example, the gate dielectric layer 112A within the seams 66A of the hybrid fins 66 may have a ratio of silicon to oxygen (Si:O) in a range from 1:1 to 1:1.5 and the gate dielectric layer 112A on the semiconductor fins 54 may have a Si:O ratio in a range from 1:1.5 to 1:2.

Figure 15A:
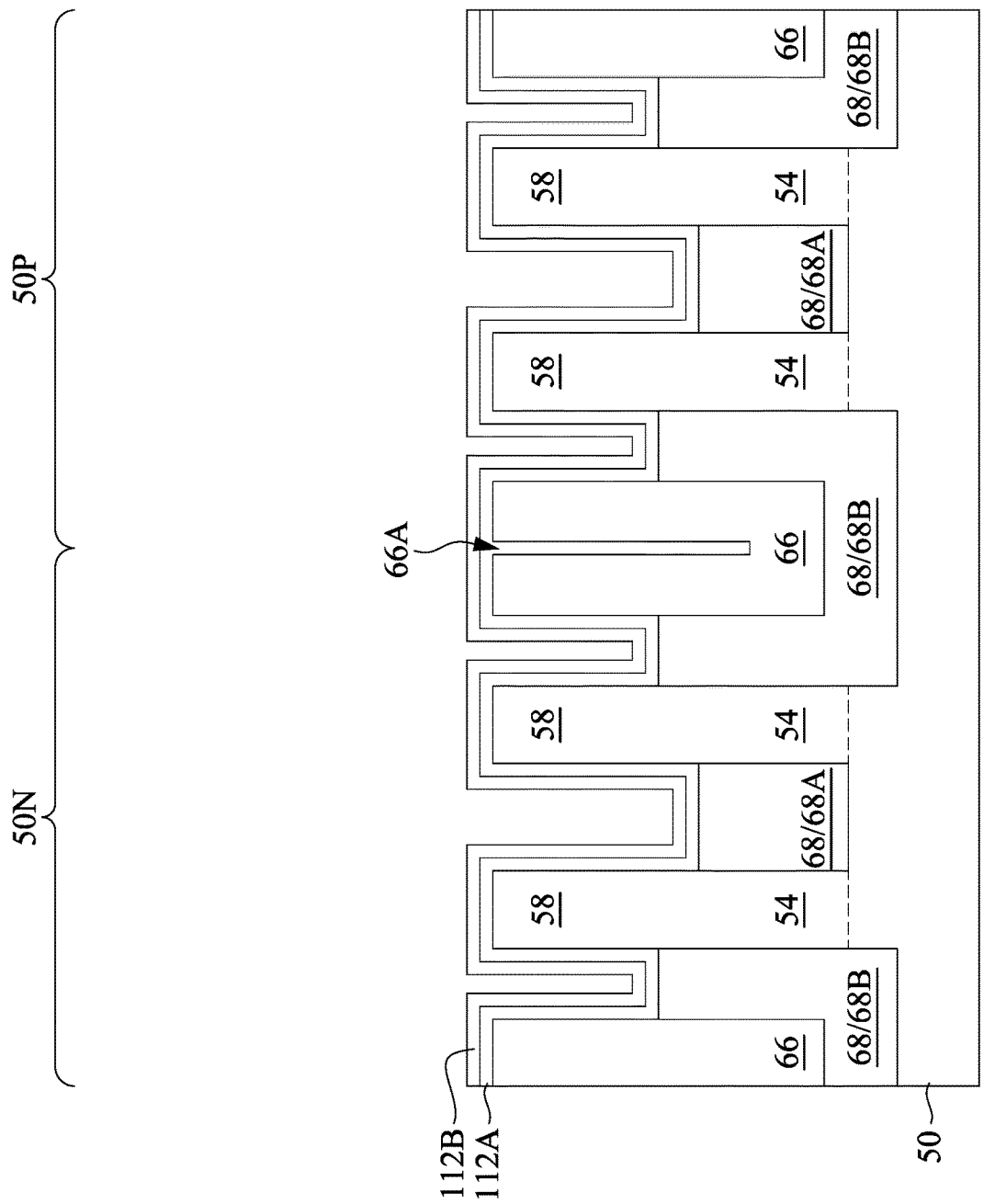
Figure 15B:
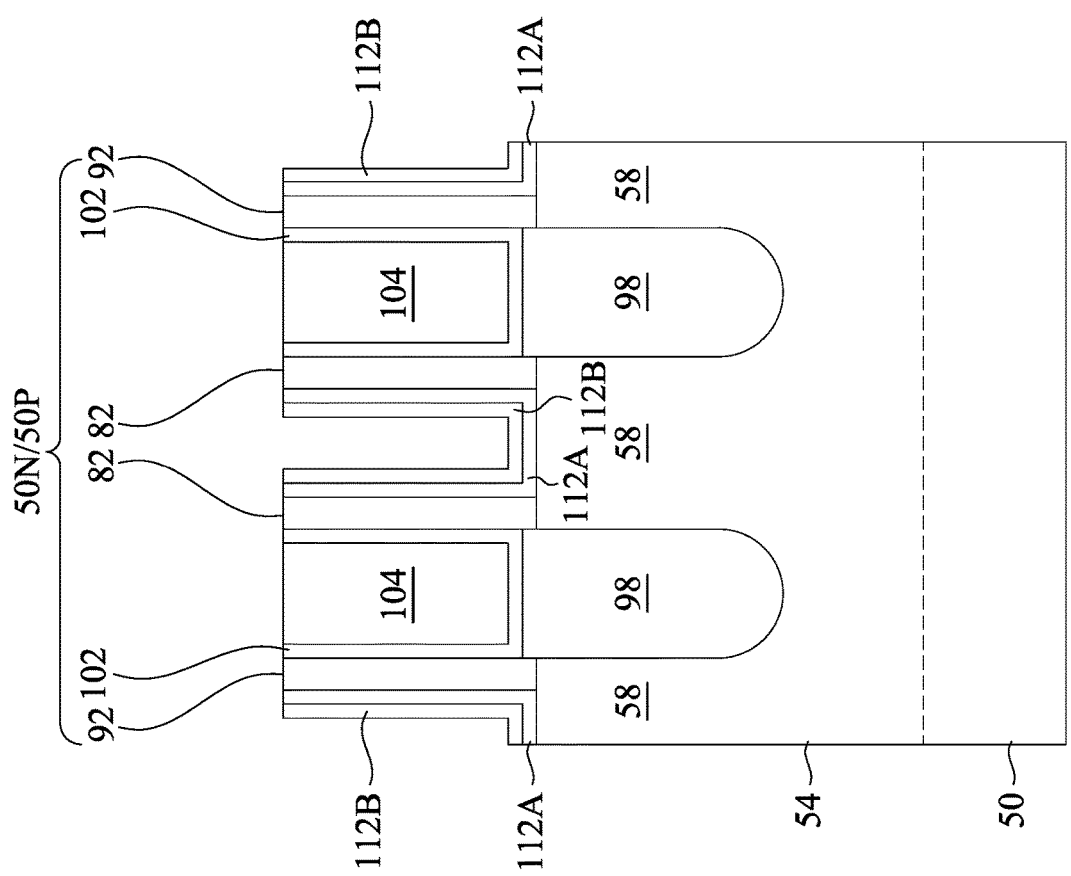
Figure 15C:
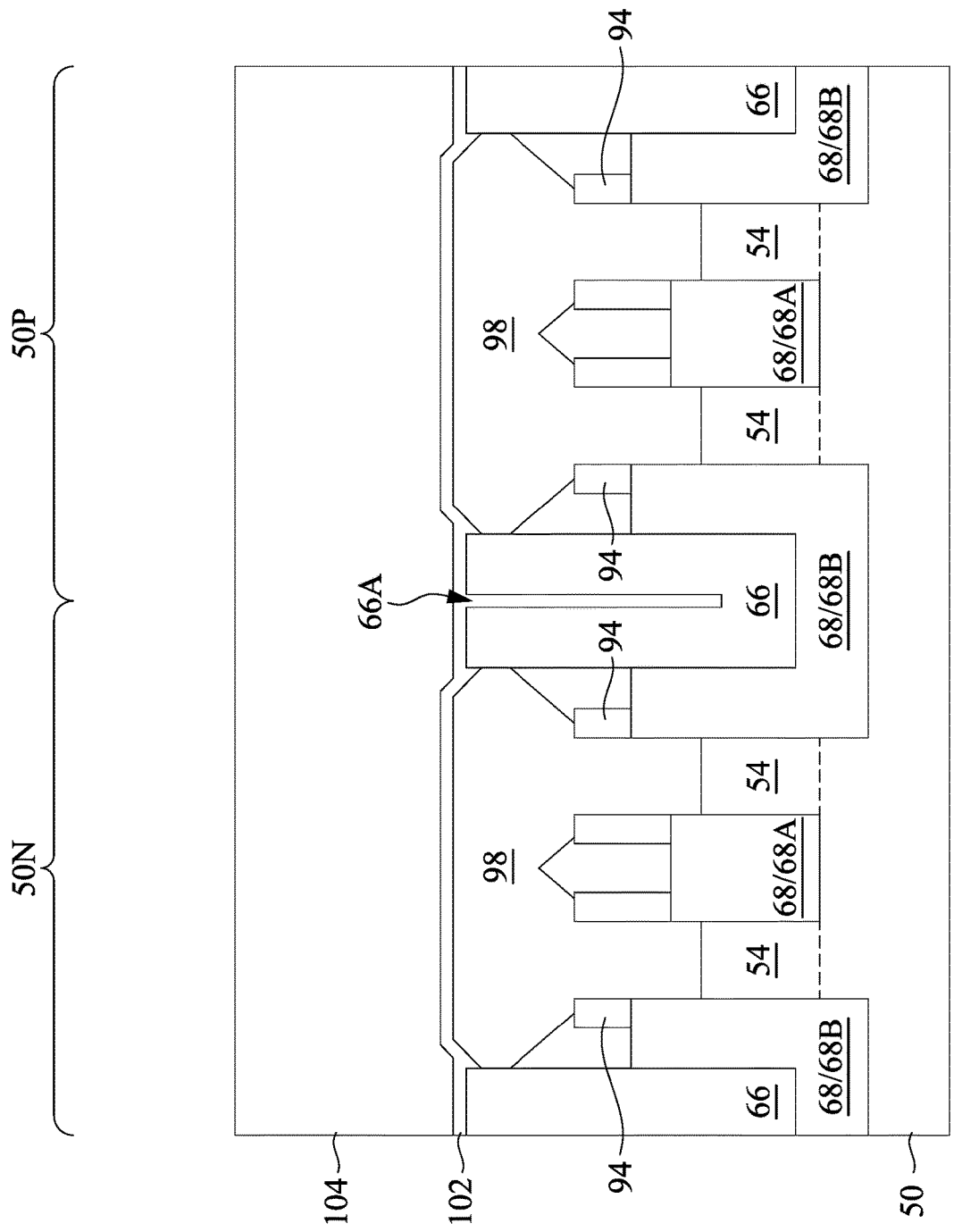
Figure 19:
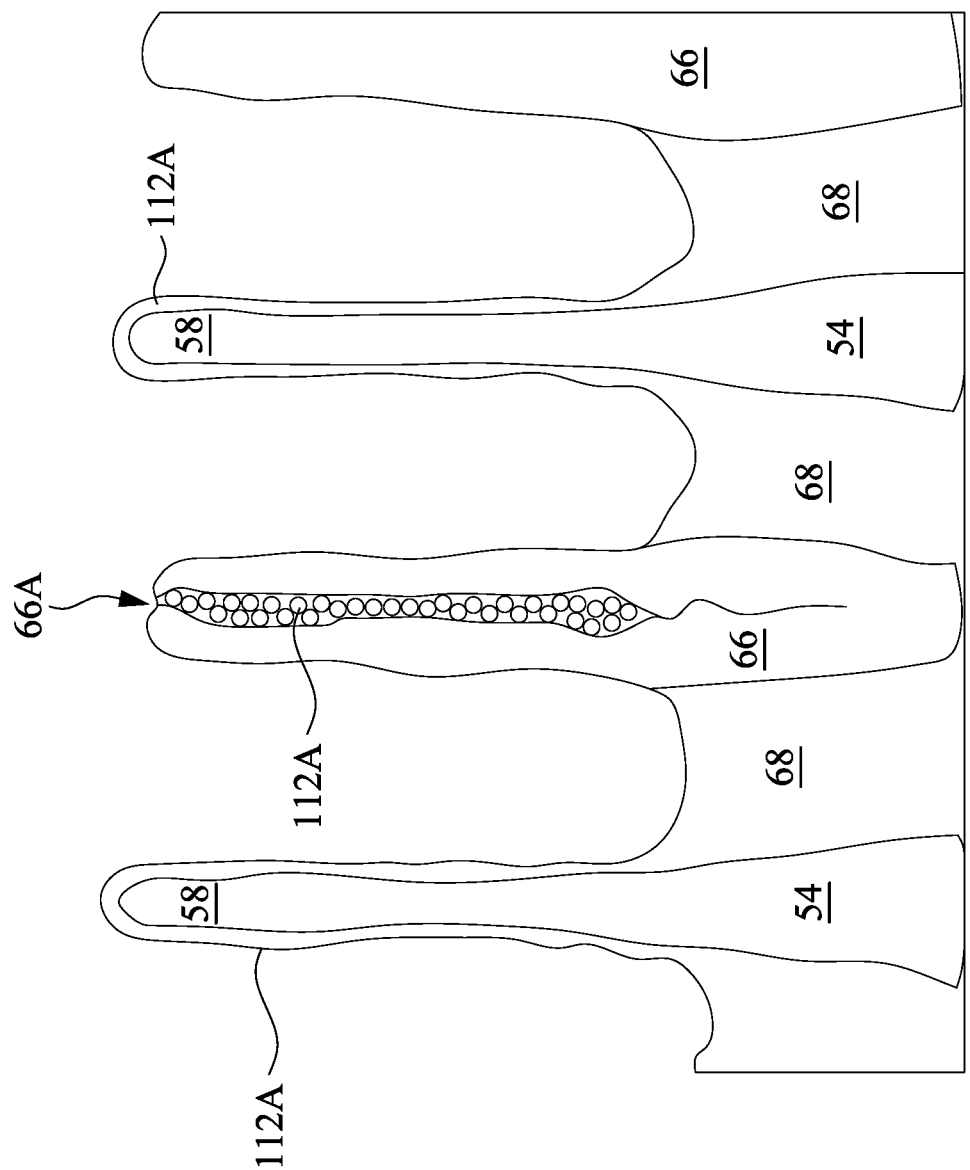

FIG. 19 illustrates a structure at a similar stage of processing as FIG. 15A in accordance with some embodiments. The formation steps and processes of this structure are similar to those described in the other embodiments and the descriptions are not repeated herein. In FIG. 19, the gate dielectric layer 112A is within the seams 66A and on the channel regions 58 of the semiconductor fins 54. In some embodiments, the gate dielectric layer 112A is not formed on outer sidewall of the hybrid fins 66 as illustrated in FIG. 19.

By filling the seams 66A of the hybrid fins 66 with the interfacial layer 112A, conductive material from subsequently formed source/drain and/or gate contacts is prevented from forming in the seams 66A. Preventing the conductive material from source/drain and/or gate contacts to form in the seams 66A prevents the source/drains and gates from shorting to each other by way of the seams 66A. Manufacturing yield of the devices may thus be improved. Also, by simultaneously forming the interfacial layer(s) under the replacement gate structures and filling the seams 66A, extra processing is not needed to fill the seams of the hybrid fins.

After the gate dielectric layer 112A is formed, the gate dielectric layer 112B is formed. The gate dielectric layer 112B may include a high-k dielectric material, such as a metal oxide or a silicate of hafnium, aluminum, zirconium, lanthanum, manganese, barium, titanium, lead, and combinations thereof. The dielectric material(s) of the gate dielectric layer 112B may be formed by molecular-beam deposition (MBD), ALD, PECVD, or the like. The gate dielectric layer 112B is not formed within the seams 66A as the seams 66A were already filled by the gate dielectric layer 112A. In embodiments where portions of the dummy dielectrics 82 remain in the recesses 106, the gate dielectric layers 112 includes a material of the dummy dielectrics 82 (e.g., silicon oxide). Although a dual-layered gate dielectric layers 112 is illustrated, the gate dielectric layers 112 may include any number of interfacial layers and any number of main layers.

Figure 16A:
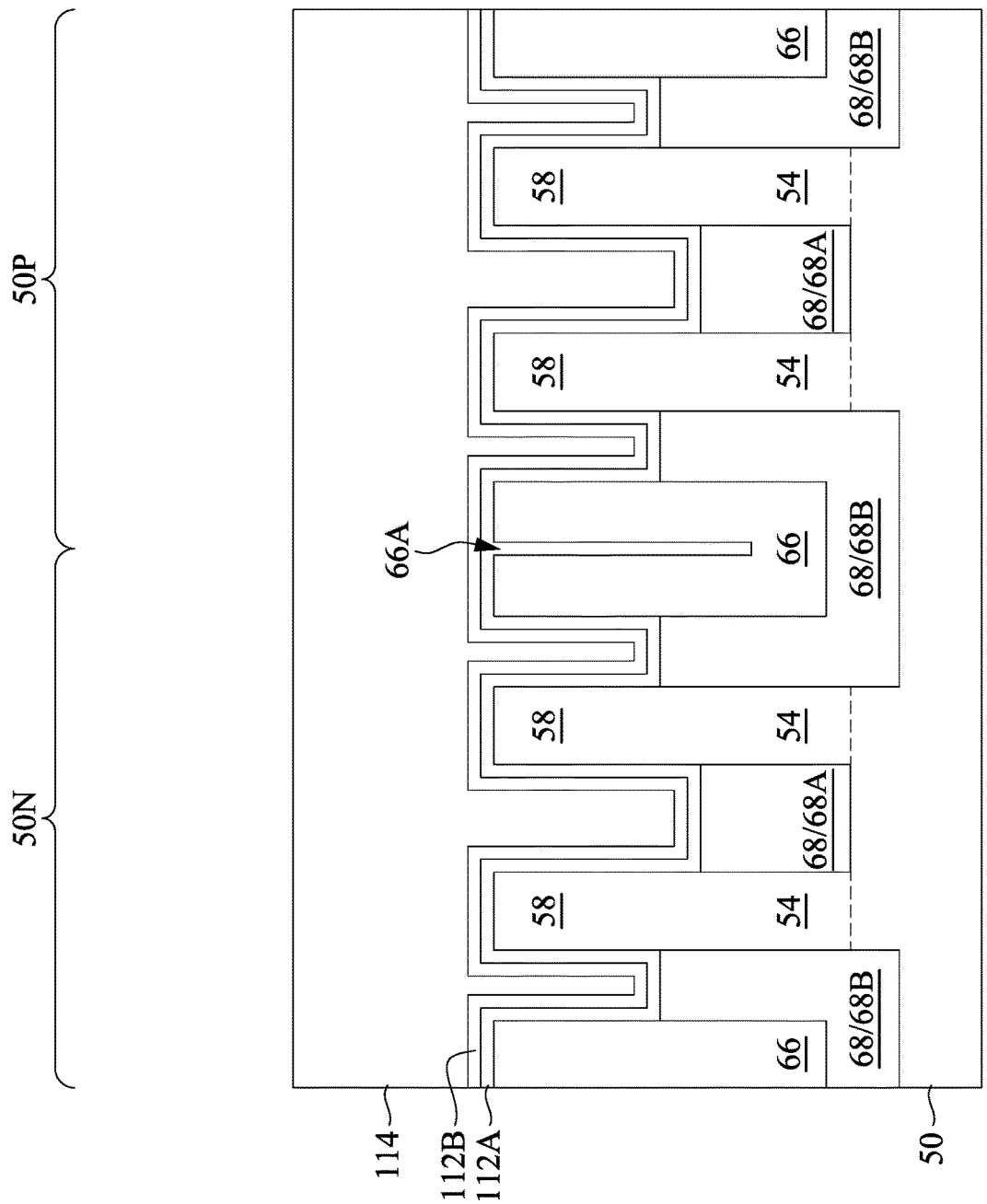
Figure 16B:
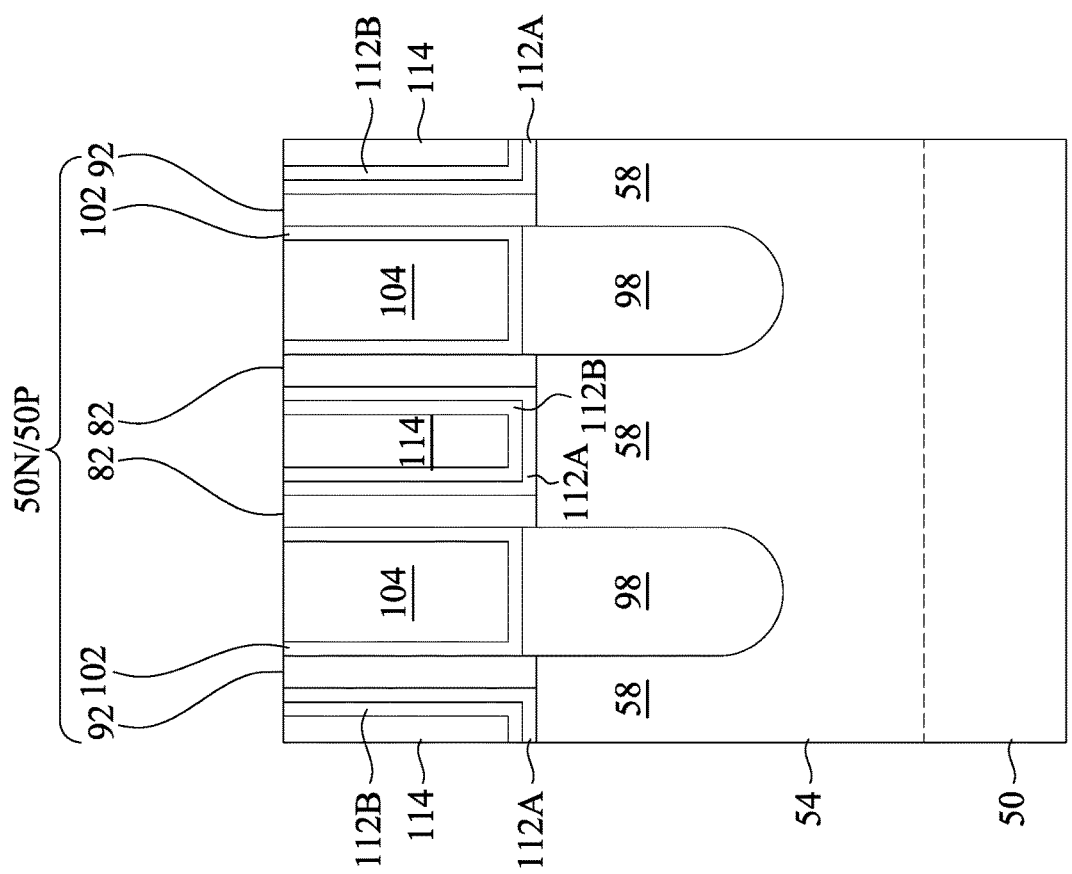
Figure 16C:
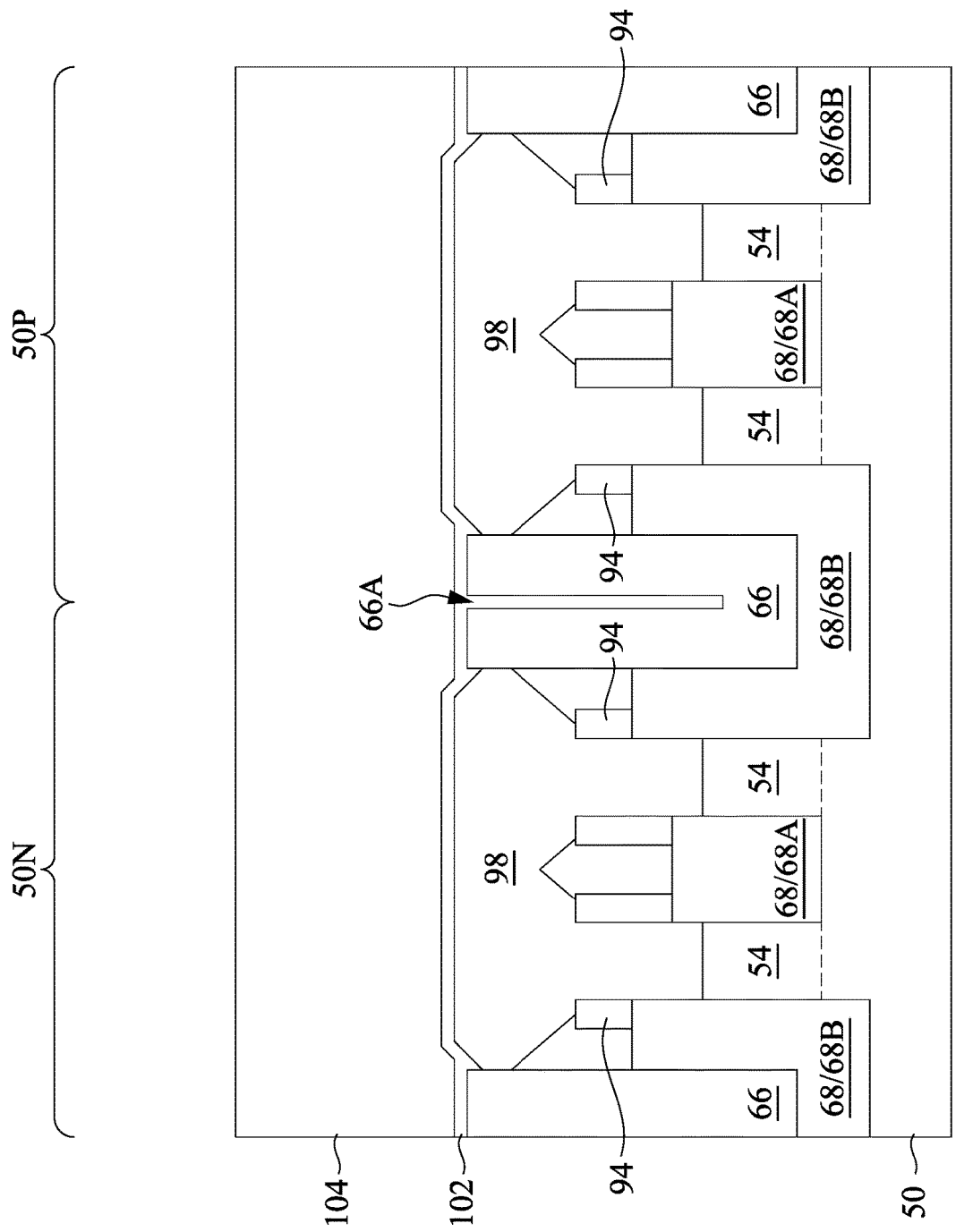

In FIGS. 16A-16C, the gate electrodes 114 including one or more gate electrode layer(s) are disposed over the gate dielectrics 112, which fill the remaining portions of the recesses 106. The gate electrodes 114 may include a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures, one or more gate dielectric layer(s) may be deposited in the recesses 106. The gate dielectric layer(s) may also be deposited on the top surfaces of the first ILD 104, the CESL 102, and the gate spacers 92. Subsequently, one or more gate electrode layer (s) may be deposited on the gate dielectric layer(s) 112. A removal process may then be performed to remove the excess portions of the gate dielectric layer(s) and the gate electrode layer(s), which excess portions are over the top surfaces of the first ILD 104, the CESL 102, and the gate spacers 92. The gate dielectric layer(s), after the removal process, have portions left in the recesses 106 (thus forming the gate dielectrics 112). The gate electrode layer(s), after the removal process, have portions left in the recesses 106 (thus forming the gate electrodes 114). In some embodiments, a planarization process such as a chemical mechanical polish (CMP), an etch-back process, combinations thereof, or the like may be utilized. After the planarization process, the top surfaces of the gate spacers 92, the CESL 102, the first ILD 104, the gate dielectrics 112A and 112B, and the gate electrodes 114 are coplanar (within process variations) such that they are level with each other.

The formation of the gate dielectrics 112A and 112B in the n-type region 50N and the p-type region 50P may occur simultaneously such that the gate dielectrics 112A and 112B in each region are formed of the same material(s), and the formation of the gate electrodes 114 may occur simultaneously such that the gate electrodes 114 in each region are formed of the same material(s). In some embodiments, the gate dielectrics 112A and 112B in each region may be formed by distinct processes, such that the gate dielectrics 112A and 112B may include different materials and/or have a different number of layers, and/or the gate electrodes 114 in each region may be formed by distinct processes, such that the gate electrodes 114 may include different materials and/or have a different number of layers. Various masking steps may be used to mask and expose appropriate regions when using distinct processes.

Figure 17A:
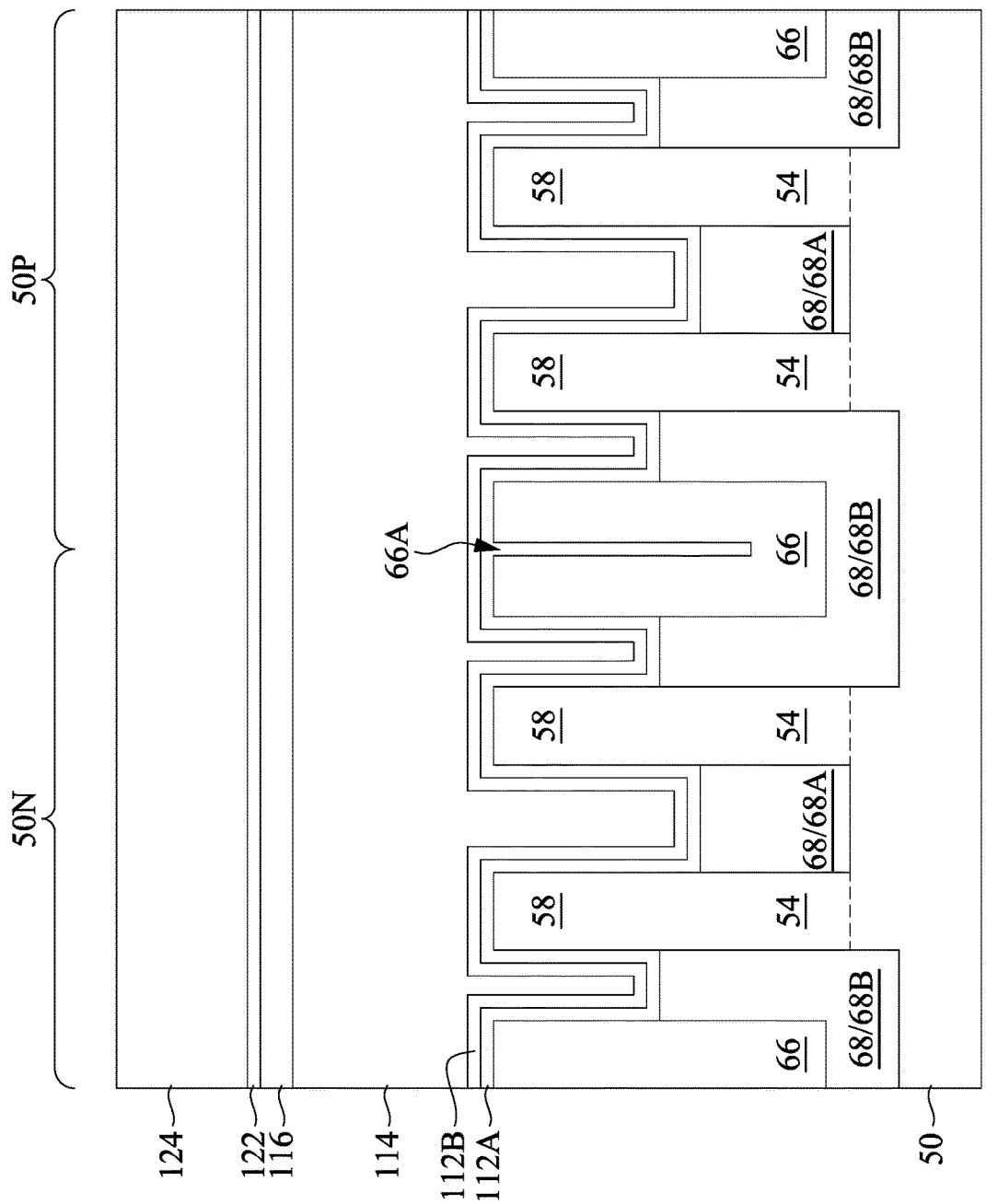
Figure 17B:
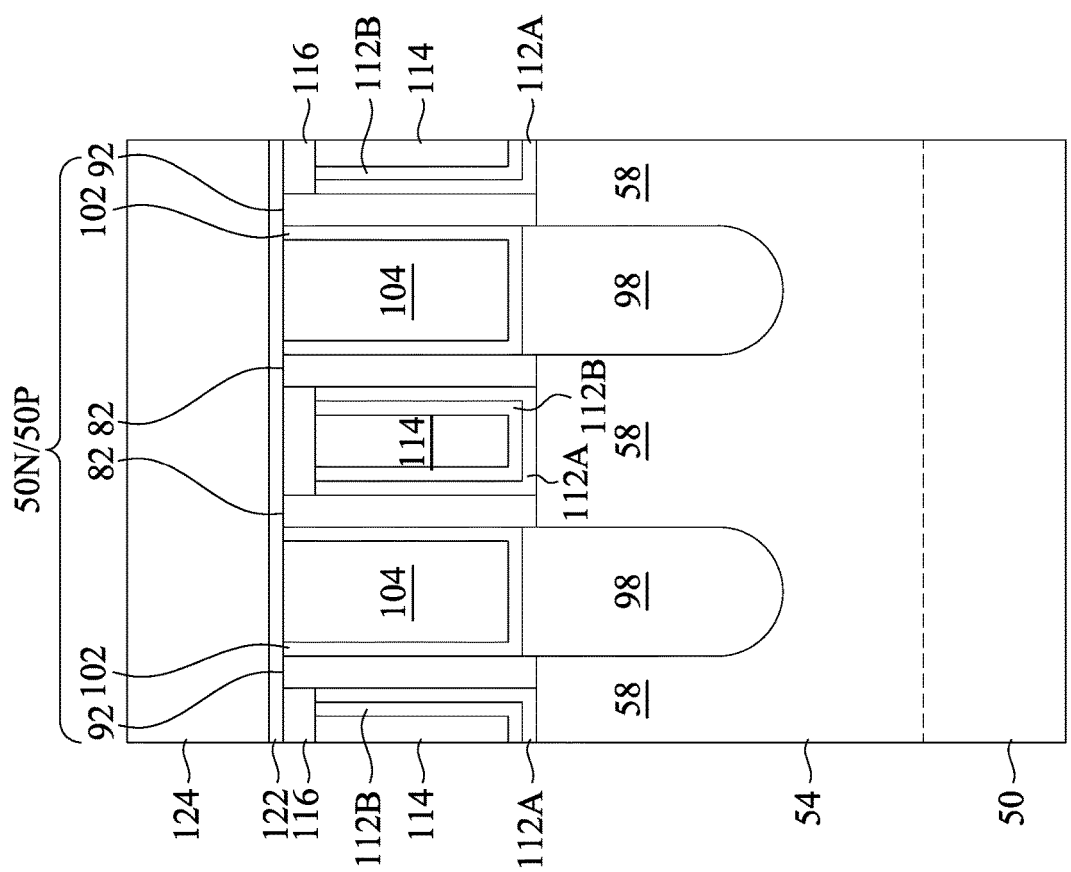
Figure 17C:
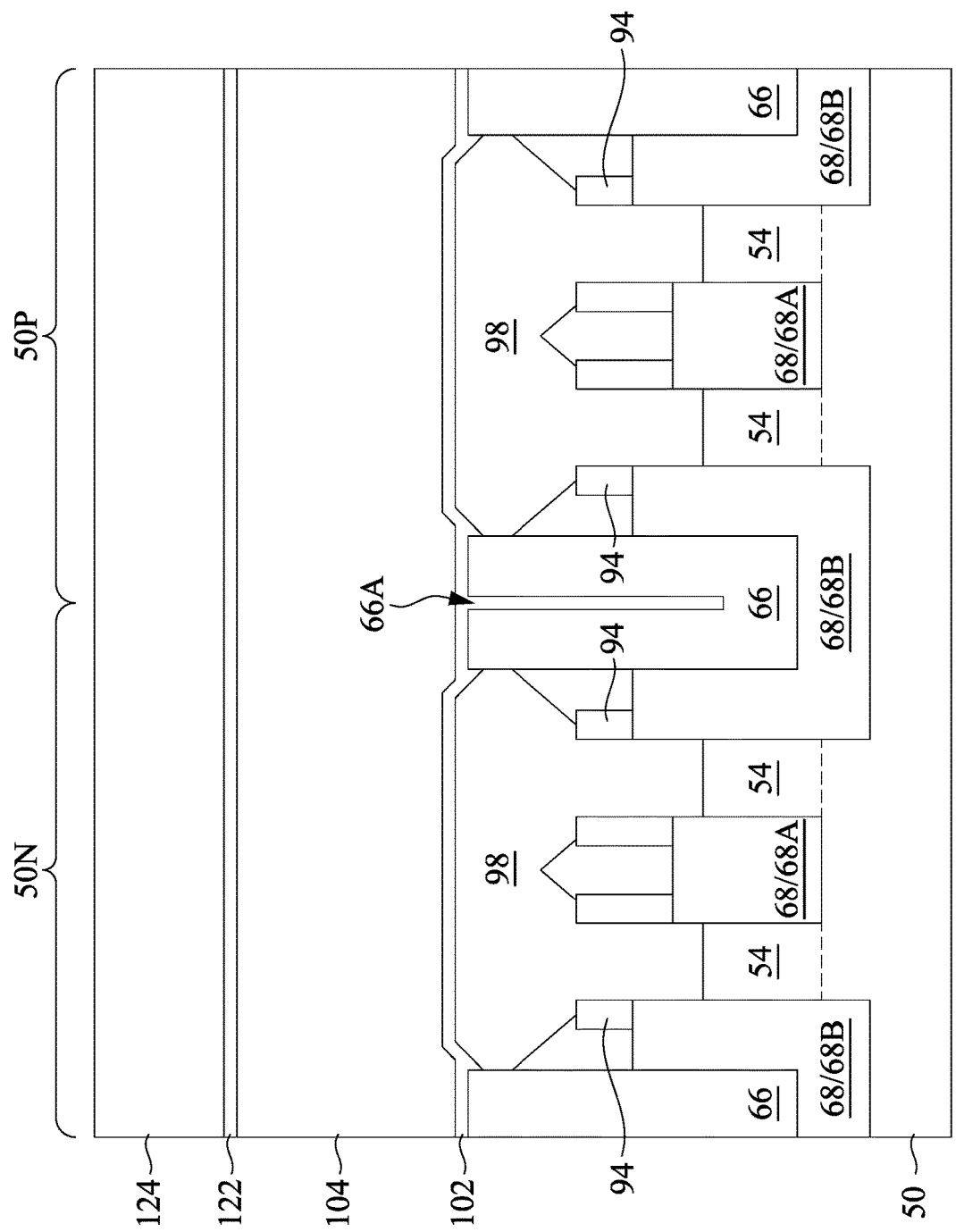

In FIGS. 17A-17C, a second ILD 124 is deposited over the gate spacers 92, the CESL 102, the first ILD 104, the gate dielectrics 112A and 112B, and the gate electrodes 114. In some embodiments, the second ILD 124 is a flowable film formed by a flowable CVD method. In some embodiments, the second ILD 124 is formed of a dielectric material such as PSG, BSG, BPSG, USG, or the like, which may be deposited by any suitable method, such as CVD, PECVD, or the like.

Optionally, before the formation of the second ILD 124, gate masks 116 are formed over the gate structures (including the gate dielectrics 112 and the gate electrodes 114). As an example to form the gate masks 116, the gate structures and optionally the gate spacers 92 may be recessed using any acceptable etching process. One or more dielectric material (s) may then be formed in the recesses and on the top surfaces of the CESL 102 and the first ILD 104. Acceptable dielectric materials include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. A removal process is performed to remove the excess portions of the dielectric material(s), which excess portions are over the top surfaces of the CESL 102 and the first ILD 104, thereby forming the gate masks 116. The dielectric material(s), after the removal process, have portions left in the recesses (thus forming the gate masks 116). In some embodiments, a planarization process such as a chemical mechanical polish (CMP), an etch-back process, combinations thereof, or the like may be utilized. After the planarization process, the top surfaces of the CESL 102, the first ILD 104, and the gate masks 116 are coplanar (within process variations) such that they are level with each other. Gate contacts will be subsequently formed to penetrate through the gate masks 116 to contact the top surfaces of the gate electrodes 114.

In some embodiments, an etch stop layer (ESL) 122 is formed between the second ILD 124 and the gate spacers 92, the CESL 102, the first ILD 104, and the gate masks 116 (if present) or the gate dielectrics 112A and 112B and the gate electrodes 114. The ESL 122 may include a dielectric material, such as, silicon nitride, silicon oxide, silicon oxynitride, or the like, having a high etching selectivity from the etching of the second ILD 124.

Figure 18A:
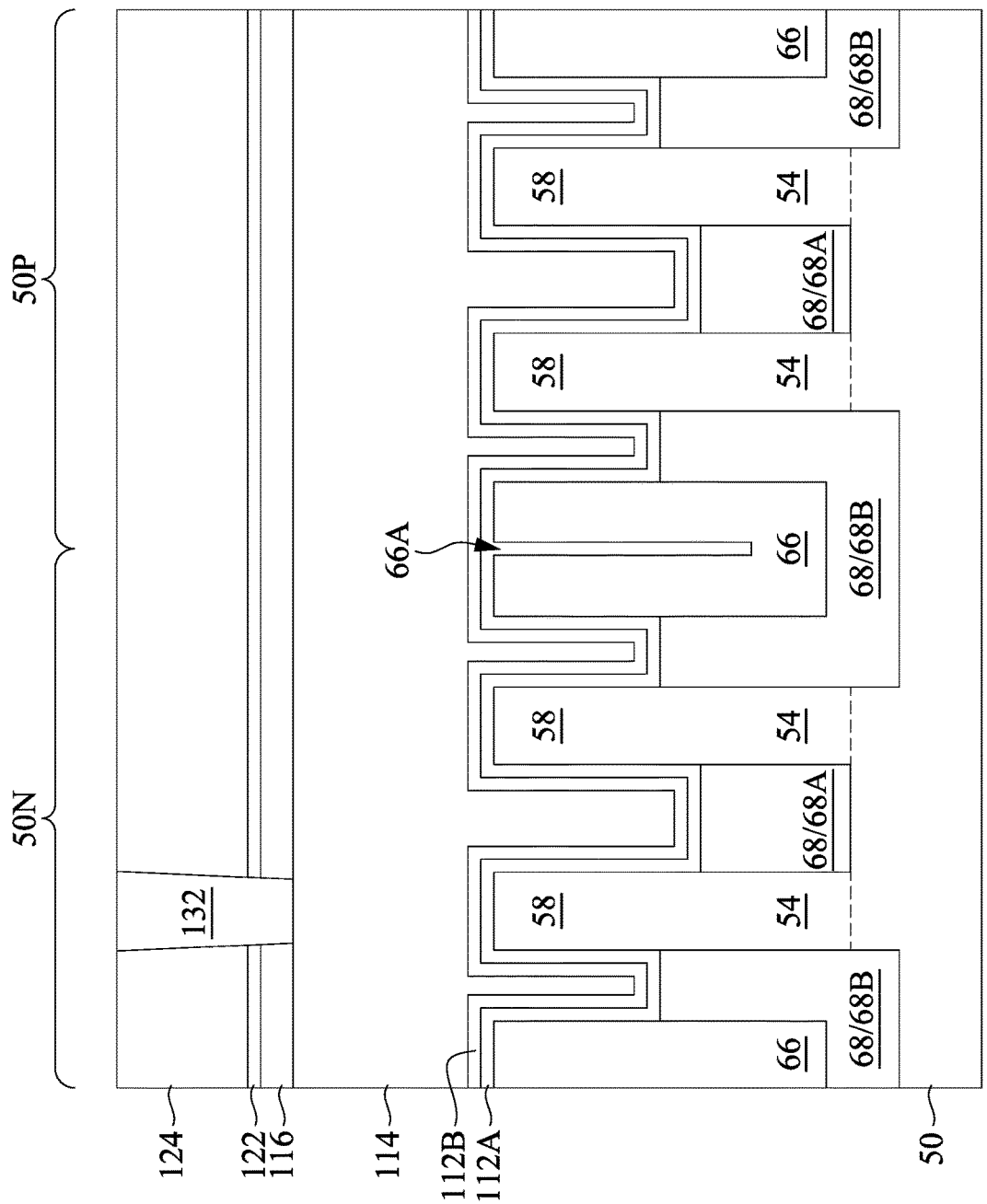
Figure 18B:
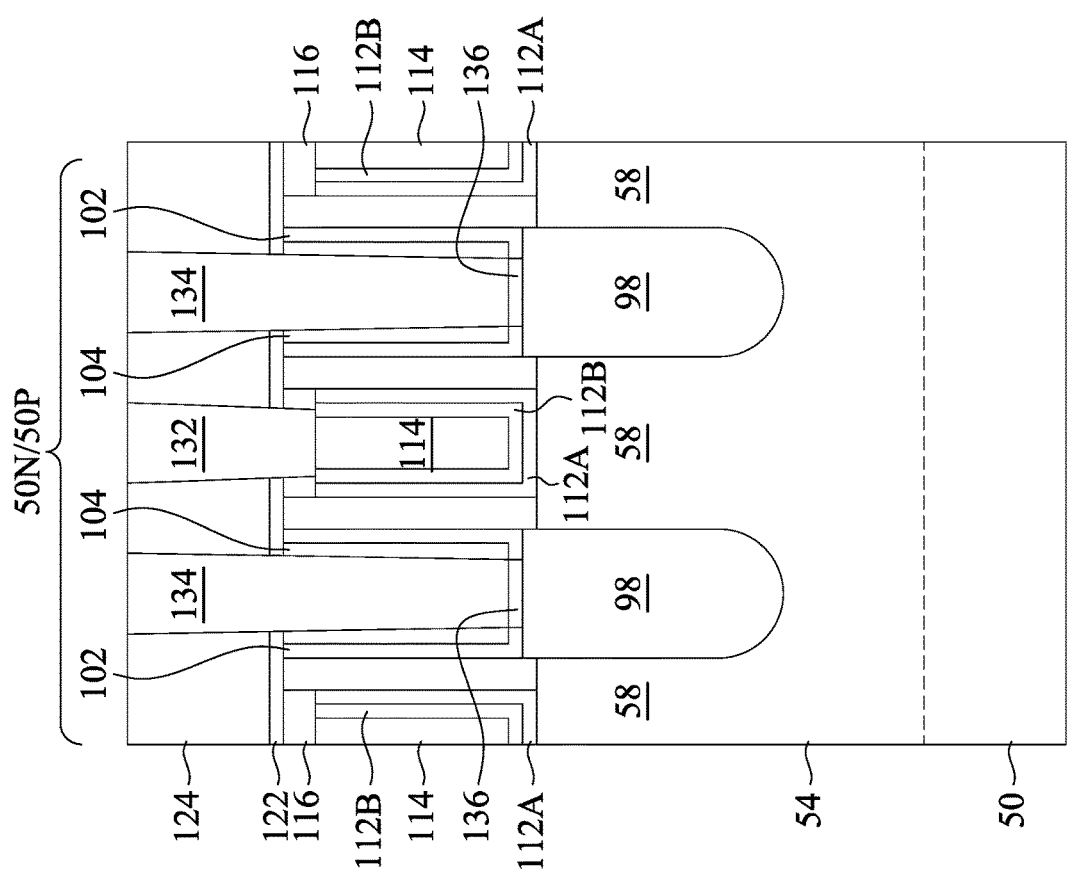
Figure 18C:
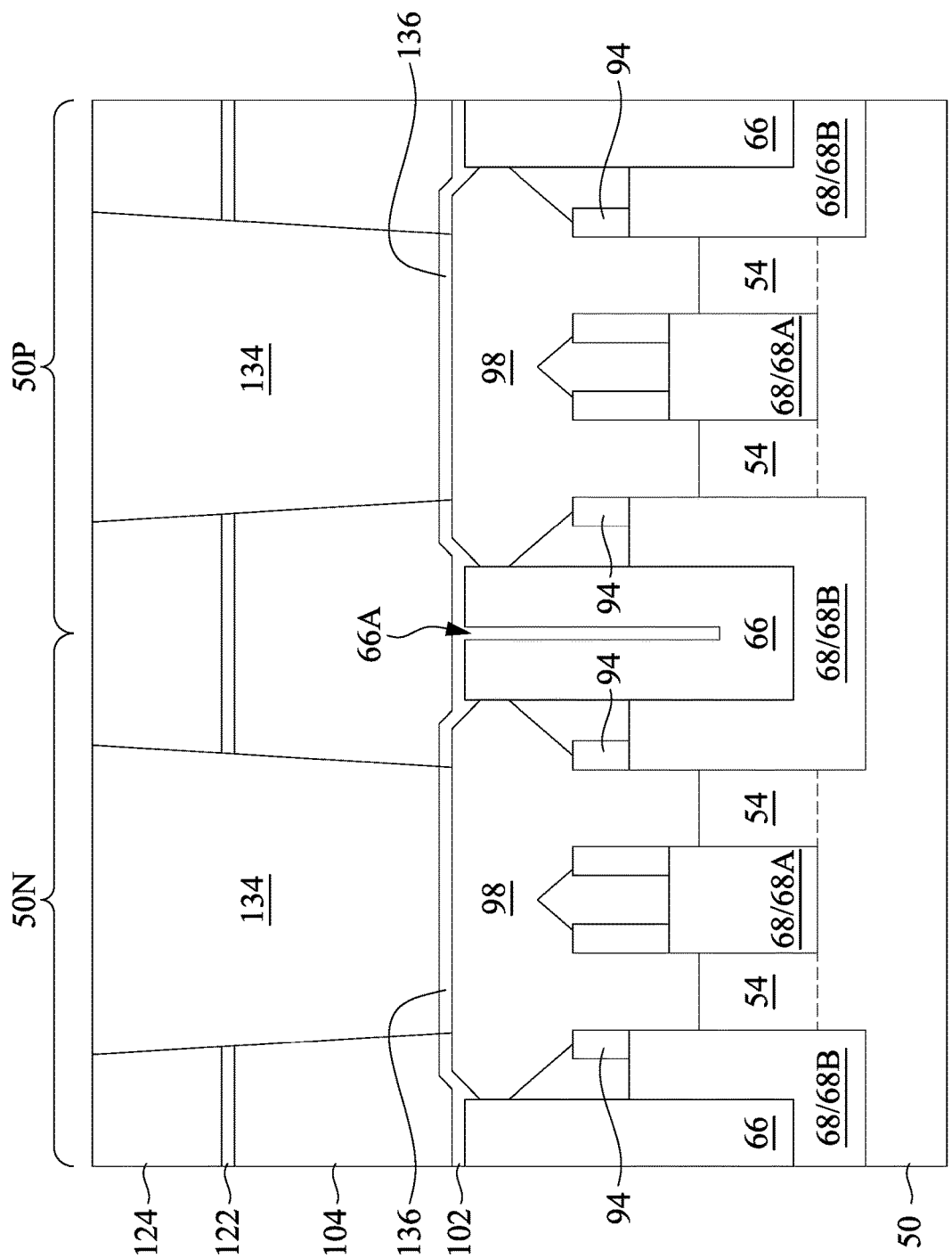

In FIGS. 18A-18C, gate contacts 132 and source/drain contacts 134 are formed to contact, respectively, the gate electrodes 114 and the epitaxial source/drain regions 98. The gate contacts 132 are physically and electrically coupled to the gate electrodes 114. The source/drain contacts 134 are physically and electrically coupled to the epitaxial source/ drain regions 98.

As an example to form the gate contacts 132 and the source/drain contacts 134, openings for the gate contacts 132 are formed through the second ILD 124, the ESL 122, and the gate masks 116, and openings for the source/drain contacts 134 are formed through the second ILD 124, the ESL 122, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 124. The remaining liner and conductive material form the gate contacts 132 and the source/drain contacts 134 in the openings. The gate contacts 132 and the source/drain contacts 134 may be formed in distinct processes, or may be formed in the same process. Although shown as being formed in the same cross-sections, it should be appreciated that each of the gate contacts 132 and the source/drain contacts 134 may be formed in different cross-sections, which may avoid shorting of the contacts.

Optionally, metal-semiconductor alloy regions 136 are formed at the interfaces between the epitaxial source/drain regions 98 and the source/drain contacts 134. The metal-semiconductor alloy regions 136 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 136 can be formed before the material(s) of the source/drain contacts 134 by depositing a metal in the openings for the source/drain contacts 134 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 134, such as from surfaces of the metal-semiconductor alloy regions 136. The material(s) of the source/drain contacts 134 can then be formed on the metal-semiconductor alloy regions 136.

Embodiments may achieve advantages. Filling seams 66A of the hybrid fins 66 with the interfacial layer 112A prevents conductive material from subsequently formed source/drain and/or gate contacts to form in the seams 66A. Preventing the conductive material from source/drain and/or gate contacts to form in the seams 66A prevents the source/drains and gates from shorting to each other by way of the seams 66A. Manufacturing yield of the devices may thus be improved. In some embodiments, the seams 66A are filled by a silicon precursor soaking process and an oxidation process. These processes simultaneously form the interfacial layer(s) under the replacement gate structures such that extra processing is not needed to fill the seams of the hybrid fins.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the gate contacts 132 and the source/drain contacts 134. Additional features, such as passive devices, memories (e.g., magnetoresistive random-access memory (MRAM), resistive random-access memory (RRAM), phase-change random access memory (PCRAM), etc.), or the like may be integrated with the interconnect structure during the BEOL process.

An embodiment includes a device including a first semiconductor fin extending from a substrate, a second semiconductor fin extending from the substrate, a hybrid fin over the substrate, the hybrid fin disposed between the first semiconductor fin and the second semiconductor fin, and the hybrid fin having an oxide inner portion extending downward from a top surface of the hybrid fin. The device also includes a first isolation region between the second semiconductor fin, the first semiconductor fin, and the hybrid fin, the hybrid fin extending above a top surface of the first isolation region, a high-k gate dielectric over sidewalls of the hybrid fin, sidewalls of the first semiconductor fin, and sidewalls of the second semiconductor fin, a gate electrode on the high-k gate dielectric, and source/drain regions on the first semiconductor fin on opposing sides of the gate electrode.

Embodiments may include one or more of the following features. The device where top surfaces of the hybrid fin, the first semiconductor fin, and the second semiconductor fin are level with each other. The first semiconductor fin includes an interfacial oxide layer between sidewalls of the first semiconductor fin and the high-k gate dielectric. The oxide inner portion of the hybrid fin is more silicon-rich than the interfacial oxide layer. The hybrid fin includes silicon nitride, tantalum oxide, aluminum oxide, zirconium oxide, hafnium oxide, silicon carbonitride, silicon oxycarbonitride, or a combination thereof. The device further including a third semiconductor fin adjacent the second semiconductor fin, a second isolation region between the second semiconductor fin and the third semiconductor fin, a top surface of the first isolation region disposed further from the substrate than a top surface of the second isolation region. A bottom surface of the first isolation region disposed further from top surfaces of the hybrid fin, the first semiconductor fin, and the second semiconductor fin than a bottom surface of the second isolation region.

An embodiment includes a method including forming a first semiconductor fin and a second semiconductor fin extending from a substrate, forming an insulation material around the first semiconductor fin and the second semiconductor fin, a first portion of the insulation material disposed between the first semiconductor fin and the second semiconductor fin. The method also includes forming a hybrid fin on the first portion of the insulation material, the hybrid fin having a seam therein. The method also includes recessing the first portion of the insulation material to form a first isolation region. The method also includes forming a dummy gate structure over the first semiconductor fin, the hybrid fin, and the second semiconductor fin. The method also includes forming source/drain regions on the first semiconductor fin and the second semiconductor fin on opposing sides of the dummy gate structure. The method also includes removing the dummy gate structure to form a gate trench. The method also includes forming a first gate dielectric layer on the first semiconductor fin, the hybrid fin, and the second semiconductor fin in the gate trench, the first gate dielectric layer filling the seam in the hybrid fin. The method also includes forming a second gate dielectric layer on the first gate dielectric layer in the gate trench. The method also includes forming a gate electrode layer on the second gate dielectric layer in the gate trench.

Embodiments may include one or more of the following features. The method where forming the hybrid fin includes depositing a dielectric layer on the insulation material between the first semiconductor fin and the second semiconductor fin unoccupied by the insulation material, removing a portion of the dielectric layer. Removing the portion of the dielectric layer includes planarizing the dielectric layer, the insulation material, the first semiconductor fin, and the second semiconductor fin, where top surfaces of the hybrid fin, the first semiconductor fin, and the second semiconductor fin are level with each other. Forming the first gate dielectric layer includes performing a silicon precursor soaking process in the gate trench, after performing the silicon precursor soaking process, performing an oxidation process in the gate trench, where after the oxidation process, the first gate dielectric layer is formed in the gate trench and in the seam of the hybrid fin. The first gate dielectric layer includes silicon oxide, and where the second gate dielectric layer includes a high-k layer. The first gate dielectric layer in the seam of the hybrid fin is more silicon-rich than the first gate dielectric layer on the first semiconductor fin. The hybrid fin includes silicon nitride, tantalum oxide, aluminum oxide, zirconium oxide, hafnium oxide, silicon carbonitride, silicon oxycarbonitride, or a combination thereof. The method further including forming an etch stop layer over the source/drain regions and the hybrid fin, the etch stop layer filling a portion of the seam in the hybrid fin outside of the gate trench, forming interlayer dielectric over the etch stop layer. The method further including forming conductive contacts through the interlayer dielectric and the etch stop layer to the source/drain regions, the conductive contacts being electrically connected to the source/drain regions.

An embodiment includes a method including forming a first semiconductor fin extending from a substrate. The method also includes forming an insulation material around the first semiconductor fin. The method also includes depositing a dielectric layer on the insulation material around the first semiconductor fin. The method also includes removing a portion of the dielectric layer to form a dielectric fin, the dielectric fin having a seam therein. The method also includes recessing the insulation material, where after recessing the insulation material, the dielectric fin extends above a top surface of the insulation material. The method also includes forming a dummy gate structure over the first semiconductor fin, the dielectric fin, and the recessed insulation material. The method also includes forming source/drain regions on the first semiconductor fin on opposing sides of the dummy gate structure. The method also includes removing the dummy gate structure to form a gate trench. The method also includes performing a silicon precursor soaking process in the gate trench. The method also includes after performing the silicon precursor soaking process, performing an oxidation process in the gate trench to form an interfacial layer on the first semiconductor fin and the dielectric fin in the gate trench, the interfacial layer filling the seam in the dielectric fin. The method also includes forming a high-k gate dielectric layer on the interfacial layer in the gate trench. The method also includes forming a gate electrode layer on the high-k gate dielectric layer in the gate trench.

Embodiments may include one or more of the following features. The method where the interfacial layer in the seam of the dielectric fin is more silicon-rich than the interfacial layer on the first semiconductor fin. The high-k gate dielectric layer is not in the seam of the dielectric fin. Removing the portion of the dielectric layer includes planarizing the dielectric layer, the insulation material, and the first semiconductor fin, where top surfaces of the dielectric fin and the first semiconductor fin are level with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first semiconductor fin extending from a substrate;
   a second semiconductor fin extending from the substrate;
   a hybrid fin over the substrate, the hybrid fin disposed between the first semiconductor fin and the second semiconductor fin, the hybrid fin having an oxide inner portion extending downward from a top surface of the hybrid fin;
   a first isolation region between the second semiconductor fin, the first semiconductor fin, and the hybrid fin, the hybrid fin extending above a top surface of the first isolation region;
   a high-k gate dielectric over sidewalls of the hybrid fin, sidewalls of the first semiconductor fin, and sidewalls of the second semiconductor fin, wherein the first semiconductor fin includes an interfacial oxide layer between sidewalls of the first semiconductor fin and the high-k gate dielectric;
   a gate electrode on the high-k gate dielectric; and
   source/drain regions on the first semiconductor fin on opposing sides of the gate electrode.

2. The device of claim 1, wherein top surfaces of the hybrid fin, the first semiconductor fin, and the second semiconductor fin are level with each other.

3. The device of claim 1, wherein the oxide inner portion of the hybrid fin is more silicon-rich than the interfacial oxide layer.

4. The device of claim 1, wherein the hybrid fin comprises silicon nitride, tantalum oxide, aluminum oxide, zirconium oxide, hafnium oxide, silicon carbonitride, silicon oxycarbonitride, or a combination thereof.

5. The device of claim 1 further comprising:
   a third semiconductor fin adjacent the second semiconductor fin; and
   a second isolation region between the second semiconductor fin and the third semiconductor fin, a top surface of the first isolation region disposed further from the substrate than a top surface of the second isolation region.

6. The device of claim 5, wherein a bottom surface of the first isolation region is disposed further from top surfaces of the hybrid fin, the first semiconductor fin, and the second semiconductor fin than a bottom surface of the second isolation region.

7. The device of claim 1, further comprising:
   an etch stop layer over the source/drain regions and the hybrid fin, the etch stop layer extending into an inner portion of the hybrid fin outside of the gate electrode;
   an interlayer dielectric over the etch stop layer; and
   conductive contacts extending through the interlayer dielectric and the etch stop layer to the source/drain regions, the conductive contacts being electrically connected to the source/drain regions.

8. A method comprising:
forming a first semiconductor fin and a second semiconductor fin extending from a substrate;
forming an insulation material around the first semiconductor fin and the second semiconductor fin, a first portion of the insulation material disposed between the first semiconductor fin and the second semiconductor fin;
forming a hybrid fin on the first portion of the insulation material, the hybrid fin having a seam therein;
recessing the first portion of the insulation material to form a first isolation region;
forming a dummy gate structure over the first semiconductor fin, the hybrid fin, and the second semiconductor fin;
forming source/drain regions on the first semiconductor fin and the second semiconductor fin on opposing sides of the dummy gate structure;
removing the dummy gate structure to form a gate trench;
forming a first gate dielectric layer on the first semiconductor fin, the hybrid fin, and the second semiconductor fin in the gate trench, the first gate dielectric layer filling the seam in the hybrid fin;
forming a second gate dielectric layer on the first gate dielectric layer in the gate trench; and
forming a gate electrode layer on the second gate dielectric layer in the gate trench.

9. The method of claim 8, wherein forming the hybrid fin comprises:
depositing a dielectric layer on the insulation material between the first semiconductor fin and the second semiconductor fin unoccupied by the insulation material; and
removing a portion of the dielectric layer.

10. The method of claim 9, wherein removing the portion of the dielectric layer comprises:
planarizing the dielectric layer, the insulation material, the first semiconductor fin, and the second semiconductor fin, wherein top surfaces of the hybrid fin, the first semiconductor fin, and the second semiconductor fin are level with each other.

11. The method of claim 8, wherein forming the first gate dielectric layer comprises:
performing a silicon precursor soaking process in the gate trench; and
after performing the silicon precursor soaking process, performing an oxidation process in the gate trench, wherein after the oxidation process, the first gate dielectric layer is formed in the gate trench and in the seam of the hybrid fin.

12. The method of claim 8, wherein the first gate dielectric layer comprises silicon oxide, and wherein the second gate dielectric layer comprises a high-k layer.

13. The method of claim 12, wherein the first gate dielectric layer in the seam of the hybrid fin is more silicon-rich than the first gate dielectric layer on the first semiconductor fin.

14. The method of claim 8, wherein the hybrid fin comprises silicon nitride, tantalum oxide, aluminum oxide, zirconium oxide, hafnium oxide, silicon carbonitride, silicon oxycarbonitride, or a combination thereof.

15. The method of claim 8 further comprising:
forming an etch stop layer over the source/drain regions and the hybrid fin, the etch stop layer filling a portion of the seam in the hybrid fin outside of the gate trench; and
forming an interlayer dielectric over the etch stop layer.

16. The method of claim 15 further comprising:
forming conductive contacts through the interlayer dielectric and the etch stop layer to the source/drain regions, the conductive contacts being electrically connected to the source/drain regions.

17. A method comprising:
forming a first semiconductor fin extending from a substrate;
forming an insulation material around the first semiconductor fin;
depositing a dielectric layer on the insulation material around the first semiconductor fin; and
removing a portion of the dielectric layer to form a dielectric fin, the dielectric fin having a seam therein;
recessing the insulation material, wherein after recessing the insulation material, the dielectric fin extends above a top surface of the insulation material;
forming a dummy gate structure over the first semiconductor fin, the dielectric fin, and the recessed insulation material;
forming source/drain regions on the first semiconductor fin on opposing sides of the dummy gate structure;
removing the dummy gate structure to form a gate trench;
performing a silicon precursor soaking process in the gate trench; and
after performing the silicon precursor soaking process, performing an oxidation process in the gate trench to form an interfacial layer on the first semiconductor fin and the dielectric fin in the gate trench, the interfacial layer filling the seam in the dielectric fin;
forming a high-k gate dielectric layer on the interfacial layer in the gate trench; and
forming a gate electrode layer on the high-k gate dielectric layer in the gate trench.

18. The method of claim 17, wherein the interfacial layer in the seam of the dielectric fin is more silicon-rich than the interfacial layer on the first semiconductor fin.

19. The method of claim 17, wherein the high-k gate dielectric layer is not in the seam of the dielectric fin.

20. The method of claim 17, wherein removing the portion of the dielectric layer comprises:
planarizing the dielectric layer, the insulation material, and the first semiconductor fin, wherein top surfaces of the dielectric fin and the first semiconductor fin are level with each other.

* * * * *